(12) United States Patent
Hiroshima

(10) Patent No.: US 6,940,143 B2
(45) Date of Patent: Sep. 6, 2005

(54) SEMICONDUCTOR THIN-FILM MANUFACTURING METHOD, SEMICONDUCTOR DEVICE MANUFACTURING METHOD, SEMICONDUCTOR DEVICE, INTEGRATED CIRCUIT, ELECTRO-OPTICAL DEVICE, AND ELECTRONIC APPLIANCE

(75) Inventor: Yasushi Hiroshima, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 30 days.

(21) Appl. No.: 10/201,720

(22) Filed: Jul. 24, 2002

(65) Prior Publication Data
US 2003/0034523 A1 Feb. 20, 2003

(30) Foreign Application Priority Data

Jul. 25, 2001 (JP) .................................... 2001-225125
Nov. 5, 2001 (JP) .................................... 2001-339681

(51) Int. Cl.[7] ............................................. H01L 31/00
(52) U.S. Cl. ....................... 257/459; 257/99; 257/100; 257/288; 257/385
(58) Field of Search ......................... 257/99, 100, 288, 257/385, 459, 347, 49–66

(56) References Cited

U.S. PATENT DOCUMENTS 6,097,088 A * 8/2000 Sakuragi
6,373,136 B2 * 4/2002 Otsuka et al. .............. 257/758

FOREIGN PATENT DOCUMENTS

JP   A-57-155765   9/1982
JP   A-58-090740   5/1983

OTHER PUBLICATIONS

IBM Technical Disclosure Bulletin, "Single Crystal Thin Film Transistors," pp. 257–258, Aug. 1993.
R. Ishihara et al., "Advanced Excimer–Laser Crystallization Techniques of Si Thin–Film for Location Control of Large Grains on Glass," Proc. SPIE, vol. 4295, pp. 14–23, 2001.
J.B. Boyce et al., "Laser Processing of Amorphous Silicon for Large–Area Polysilicon Imagers," Thin Solid Films, vol. 383, pp. 137–142, 2001.

* cited by examiner

Primary Examiner—Fetsum Abraham
(74) Attorney, Agent, or Firm—Oliff & Berridge, PLC

(57) ABSTRACT

According to the semiconductor thin-film and semiconductor device manufacturing method of the present invention, an insulating film having a through-hole between two layers of silicon film is provided, the silicon film is partially melted by irradiating a laser thereon, and a substantially monocrystalline film is continuously formed extending via the through-hole from at least part of the layer of silicon film below the insulating film that continues to the through-hole, to at least part of the layer of silicon film above the insulating film. It is therefore sufficient to form a through-hole with a larger diameter than that of a hole formed by the conventional method, because the diameter of the through-hole in the insulating film may be the same size or slightly smaller than the size of a single crystal grain that comprises the polycrystal formed in the silicon film below the insulating film. Costly precision exposure devices and etching devices are therefore unnecessary. Numerous high-performance semiconductor devices can also be formed easily on a large glass substrate, as in large liquid-crystal displays and the like.

23 Claims, 16 Drawing Sheets

SEMICONDUCTOR THIN-FILM MANUFACTURING METHOD, SEMICONDUCTOR DEVICE MANUFACTURING METHOD, SEMICONDUCTOR DEVICE, INTEGRATED CIRCUIT, ELECTRO-OPTICAL DEVICE, AND ELECTRONIC APPLIANCE

BACKGROUND OF THE INVENTION

1. Field of the Invention

The present invention relates to a semiconductor thin film and semiconductor device manufacturing method, and particularly to an improvement of a semiconductor thin-film formation method whereby a substantially monocrystalline silicon film can be formed in a suitable manner.

2. Description of the Related Art

Methods for manufacturing thin-film semiconductor devices whereby amorphous silicon films are heat-treated by a laser to form a polycrystalline silicon film, and the resulting polycrystalline silicon film is used as a semiconductor film to form gate electrodes and wiring on a thin metal film have been proposed for manufacturing thin-film semiconductor devices represented by polycrystalline silicon thin-film transistors (p-Si TFT) at comparatively low temperatures. With these methods, however, it is difficult to control the energy of laser, and the manufactured semiconductor films have nonuniform properties, so techniques that are free of these drawbacks and allow substantially monocrystalline silicon films to be grown have been proposed instead (see publications "Single Crystal Thin film Transistors," *IBM Technical Disclosure Bulletin*, August 1993, pp. 257–258, and "Advanced Excimer-Laser Crystallization Techniques of Si Thin-Film For Location Control of Large Grain on Glass," R. Ishihara et al, *Proc. SPIE* 2001, vol. 4295, pp. 14–23).

These publications disclose techniques in which a hole is formed in an insulating film on a substrate, an amorphous silicon film is formed on the insulating film and in the hole, the amorphous silicon film is irradiated by a laser, and the amorphous silicon in the bottom portions of the hole is kept in an unmelted state while the amorphous silicon film on other portions is melted, whereby crystals are grown using the amorphous silicon in the unmelted state as a crystal nucleus, and a silicon film in a substantially monocrystalline state is formed.

In the methods formed in these two publications, a plurality of crystal nuclei form in the bottom portion of the hole if the cross-section of the hole is not made sufficiently small, so expensive precision exposure devices and etching devices are needed to form a hole with such a diameter (50 nm to 150 nm).

In addition, hole formation is difficult when these devices are used to form numerous thin-film transistors on large glass substrates, as is the case with large liquid-crystal displays and the like.

SUMMARY OF THE INVENTION

With the foregoing in view, it is an object of the present invention to form a semiconductor thin film having an adequate substantially monocrystalline silicon film without the use of costly precision exposure devices or etching devices.

Aimed at attaining the stated object, the present invention is a semiconductor thin-film manufacturing method comprising a step for providing an insulating film having a through-hole between two layers of silicon film; and a step for partially melting the silicon film by irradiation with a laser, and continuously forming a substantially monocrystalline film extending via the through-hole from at least part of the layer of silicon film below the insulating film to at least part of the layer of silicon film above the insulating film. This method is referred to as the basic method of the present invention.

In the present invention, an area centered around the through-hole in the surface of the layer of silicon film above the insulating film is fashioned into a substantially monocrystalline silicon film by inducing crystal growth, with the nucleus thereof comprising a single crystal grain from among a plurality of crystal grains generated in the layer of silicon film below the insulating film, because solidification of the melted silicon after laser irradiation begins in the layer of silicon film below the insulating film and proceeds to the layer of silicon film above the insulating film via the through-hole in the insulating film. It is therefore sufficient to form a through-hole with a larger diameter than that of a hole formed by the conventional method, because the diameter of the through-hole in the insulating film may be the same size or slightly smaller (a diameter of 0.2 $\mu$m–1.0 $\mu$m, for example) than the size of a single crystal grain that comprises the polycrystal formed on the layer of silicon film below the insulating film.

"Substantially monocrystalline" in the present invention includes not only cases in which crystal grains are singular, but also similar states, such as those in which a plurality of monocrystals are assembled together, yet are few in number, thereby providing characteristics that are identical to those of a semiconductor thin film that is formed in a substantially monocrystalline fashion as far as the semiconductor thin-film characteristics thereof are concerned.

"Through-hole" in the present invention refers to a passage extending through the insulating film from above and beneath, with no particular distinction as to the cross-sectional shape thereof. The "through-hole" also does not necessarily require a cylindrical shape with a uniform diameter in all parts thereof, and the cross-sectional diameter may differ in each part.

"Continuously formed" in the present invention denotes crystal growth without the occurrence of interfacial boundaries.

The present invention is also a semiconductor thin-film manufacturing method comprising a step for forming a first amorphous silicon film on a first insulating film; a step for forming a second insulating film on the first amorphous silicon film and forming a through-hole at a prescribed location in the surface of the second insulating film; a step for forming a second amorphous silicon film on the second insulating film by depositing amorphous silicon onto the second insulating film and into the through-hole; and a step for converting an area centered around the through-hole in the surface of the second amorphous silicon film into substantially monocrystalline silicon by irradiating a laser onto the second amorphous silicon film to bring the second amorphous silicon film to a completely-melted state and the first amorphous silicon film to a partially melted state. This method is referred to as method 1 of the present invention.

The present invention is also a semiconductor thin-film manufacturing method comprising a step for forming a second insulating film comprising a different material from the first insulating film on a first insulating film; a step for forming a through-hole at a prescribed location in the surface of the second insulating film; a step for forming a concave portion with a larger cross-section than the through-hole at the location of the through-hole in the first insulating film; a step for forming an amorphous silicon film on the second insulating film by depositing amorphous silicon onto the second insulating film, into the through-hole, and into the concave portion; and a step for converting an area centered around the through-hole in the surface of the amorphous silicon film into substantially monocrystalline silicon by irradiating a laser onto the amorphous silicon film to bring the amorphous silicon film to a completely-melted state and the amorphous silicon film in the concave portion to a partially melted state. This method is referred to as method 2 of the present invention.

Furthermore, the present invention is also a semiconductor thin-film manufacturing method comprising a step for forming a concave portion at a prescribed location in the surface of the first insulating film; a step for depositing amorphous silicon into the concave portion; a step for forming a second insulating film on the first insulating film; a step for forming a through-hole with a cross-section smaller than the concave portion at the location of the concave portion in the second insulating film; a step for forming an amorphous silicon film on the second insulating film by depositing amorphous silicon onto the second insulating film and into the through-hole; and a step for converting an area centered around the through-hole in the surface of the amorphous silicon film into substantially monocrystalline silicon by irradiating a laser onto the amorphous silicon film to bring the amorphous silicon film to a completely-melted state and the amorphous silicon film in the concave portion to a partially melted state. This method is referred to as method 3 of the present invention.

The present invention is a semiconductor thin-film manufacturing method comprising a step for forming a first amorphous silicon film on a first insulating film; a step for converting the first amorphous silicon film into a polycrystalline silicon film by laser irradiation to the first amorphous silicon film; a step for forming a second insulating film on the polycrystalline silicon film; a step for forming a through-hole in the second insulating film; a step for forming a second amorphous silicon film on the second insulating film so as to fill the through-hole; and a step for converting the second amorphous silicon film centered around the through-hole into a substantially monocrystalline silicon film by irradiating a laser to the second amorphous silicon film to bring the second amorphous silicon film to a completely-melted state, with the polycrystalline silicon film remaining in an unmelted or partially melted state. This method is referred to as method 4 of the present invention.

In method 1 of the present invention, solidification of the silicon after laser irradiation begins in the first amorphous silicon film and proceeds to the second amorphous silicon film via the through-hole in the second insulating film. Consequently, an area centered around the through-hole in the surface of the second amorphous silicon film becomes a substantially monocrystalline silicon film due to the occurrence of crystal growth, with the nucleus thereof comprising a single crystal grain from among numerous crystal grains generated in the first amorphous silicon film. It is therefore sufficient to form a through-hole with a larger diameter than that of a hole formed by the conventional method, because the cross-sectional size of the through-hole in the second insulating film may be the same size or slightly smaller (a diameter of 0.2 $\mu$m–1.0 $\mu$m, for example) than the size of a single crystal grain that comprises the polycrystal formed in the first amorphous silicon film. The thickness of the second insulating film in which the through-hole is opened may also be approximately the same size as the cross-sectional size of the through-hole (the diameter thereof if the cross-section is circular).

In methods 2 and 3 of the present invention, solidification of the silicon after laser irradiation begins first with the first amorphous silicon in the concave portion, and proceeds to the completely-melted amorphous silicon film via the through-hole in the second insulating film. Consequently, an area centered around the through-hole in the surface of the amorphous silicon film becomes a substantially monocrystalline silicon film due to the occurrence of crystal growth, with the nucleus thereof comprising a single crystal grain from among numerous crystal grains generated in the amorphous silicon in the concave portion. It is therefore sufficient to form a through-hole with a larger diameter than that of a hole formed by the conventional method, because the cross-sectional size of the through-hole in the second insulating film may be the same or slightly smaller (a diameter of 0.2 $\mu$m–1.0 $\mu$m, for example) than the size of a single crystal grain that comprises the polycrystal formed in the amorphous silicon in the concave portion. The thickness of the second insulating film in which the through-hole is opened may also be approximately the same size as the cross-sectional size of the through-hole (the diameter thereof if the cross-section is circular).

In method 4 of the present invention, solidification of the silicon after laser irradiation begins first with the surface of the first amorphous silicon film that is converted to a polycrystalline silicon film, and proceeds to the completely-melted amorphous silicon film via the through-hole in the second insulating film. Consequently, an area centered around the through-hole in the surface of the amorphous silicon film becomes a substantially monocrystalline silicon film due to the occurrence of crystal growth, with the nucleus thereof comprising one of the crystal grains in the polycrystalline silicon film. It is therefore sufficient to form a through-hole with a larger diameter than that of a hole formed by the conventional method, because the cross-sectional size of the through-hole in the second insulating film may be the same or slightly smaller (a diameter of 0.2 $\mu$m–1.0 $\mu$m, for example) than the size of a single crystal grain that comprises the polycrystal. The thickness of the second insulating film in which the through-hole is opened may also be approximately the same size as the cross-sectional size of the through-hole (the diameter thereof if the cross-section is circular).

Costly precision exposure devices and etching devices such as those employed in the conventional method are therefore no longer needed to form minute holes (through-holes and concave portions) for the purpose of monocrystal growth according to methods 1–4 of the present invention.

Specifically, the diameter of the through-hole may be the same or slightly smaller than the size of a single crystal grain contained in the polycrystalline silicon film according to the semiconductor thin-film manufacturing method of the present invention.

The first insulating film and second insulating film may comprise silicon oxide films, and a silicon nitride film may be formed as the layer below the first insulating film in inventions 1–4 of the present invention.

Furthermore, the first insulating film may be a silicon nitride film, and the second insulating film may be a silicon oxide film in invention 2 and invention 3 of the present invention.

Yet furthermore, the present invention may comprise a step for forming a semiconductor device in which a substantially monocrystalline silicon film manufactured according to the present inventions described above is used as a semiconductor thin film.

"Semiconductor device" in the present invention refers to a device provided with a substantially monocrystalline silicon film, and comprises any single element such as a transistor, diode, resistor, inductor, capacitor, or other active/passive element.

In the semiconductor device manufacturing method of the present invention, it is preferable to form a semiconductor device such that the portion of the substantially monocrystalline silicon film not containing the through-hole is used as a semiconductor thin film. This is because the crystal film characteristics are more stable farther away from the through-hole.

The semiconductor device manufactured according to the semiconductor device manufacturing method of the present invention is a thin-film transistor, and the through-hole is disposed according to the location in which the thin-film transistor is formed.

The semiconductor device manufactured according to the basic method of the present invention comprises an insulating film having a through-hole; and a substantially monocrystalline silicon film continuously formed inside the through-hole, on at least part of the layer below the insulating film extending into the through-hole, and on at least part of the layer above the insulating film extending into the through-hole; and uses a substantially monocrystalline silicon film as a semiconductor thin film.

The semiconductor device manufactured according to method 1 of the present invention comprises a substantially polycrystalline silicon film as the layer below the insulating film; and the monocrystalline silicon film is continuously formed up to the through-hole and layer above the insulating film from at least part of the polycrystalline silicon film. Specifically, this is because the amorphous silicon film becomes a polycrystalline silicon film by means of laser irradiation, and the substantially monocrystalline silicon film is grown from the crystal grains of the polycrystalline silicon film.

The semiconductor device manufactured according to method 2 or 3 of the present invention comprises as the layer below the insulating film an insulating film having a concave portion in the part which continues into the through-hole; and the substantially monocrystalline silicon film is continuously formed up to the through-hole and layer above the insulating film from at least part of the concave portion. Specifically, this is because the substantially monocrystalline silicon film is grown from a single crystal grain of the polycrystalline silicon formed by laser irradiation.

The semiconductor device manufactured according to method 4 of the present invention comprises a polycrystalline silicon film as the layer below the insulating film; and the substantially monocrystalline silicon film is continuously formed up to the layer above the insulating film, with a crystal grain contained in the polycrystalline silicon film as the nucleus thereof. Specifically, this is because the amorphous silicon film is converted to a polycrystalline silicon film by laser irradiation, and the substantially monocrystalline silicon film grows from one of the crystal grains thereof.

Specifically, the semiconductor device of the present invention comprises a polycrystalline silicon film formed on the first insulating film; a second insulating film with a through-hole formed on the polycrystalline silicon film; and a substantially monocrystalline silicon film formed on the second insulating film and contiguous with the polycrystalline silicon film via the through-hole, with crystal grains contained in the polycrystalline silicon film as nuclei thereof.

The semiconductor device of the present invention comprises a first insulating film having a concave portion that contains substantially polycrystalline silicon; a second insulating film having a through-hole in a location continuing to the concave portion, formed on the first insulating film; and a substantially monocrystalline silicon film formed on the second insulating film and contiguous with the polycrystalline silicon film in the concave portion via the through-hole, with crystal grains contained in the polycrystalline silicon film as nuclei thereof.

In the present invention, the first insulating film and the second insulating film may be silicon oxide films, and a silicon nitride film may be further formed on the lower layer of the first insulating film. The silicon nitride film may be formed in any manner.

The present invention is configured using the portion not containing the through-hole in the surface of the substantially monocrystalline silicon as a semiconductor thin film. This is because the crystal film characteristics are more stable farther away from the through-hole.

The substantially monocrystalline silicon film that comprises the semiconductor thin film is separated from the through-hole in the present invention. Specifically, this is because the crystals between the through-hole and the area utilized as the semiconductor thin film are connected together because crystallization occurs continuously from the through-hole during manufacture of the substantially monocrystalline silicon film, but no problems are encountered when the semiconductor thin film in the through-hole and in the utilized area is separated by etching or the like following formation of the semiconductor thin film. Therefore, substantially monocrystalline silicon may or may not exist in the through-hole after the semiconductor device is manufactured.

The present invention is an integrated circuit, electro-optical device, and electronic appliance provided with the semiconductor device of the present invention.

As used herein, "integrated circuit" refers to a circuit (chip) in which a semiconductor device, interconnected wiring, and the like is integrated and wired to achieve a specific function.

The present invention comprises a plurality of pixel areas, a semiconductor device disposed in each pixel area, and electrooptic elements controlled by the semiconductor devices in an electro-optical device; wherein the semiconductor device is manufactured according to the semiconductor device manufacturing method of the present invention.

As used herein, "electro-optical device" refers to a general device provided with the semiconductor device of the present invention, provided with electro-optical elements for emitting light by means of electronic action or for altering the conditions of external light; and includes both devices for independently emitting light, and devices for controlling the transmission of external light. The electro-optical elements referred to herein include, for example, liquid crystal elements, electrophoretic elements having a dispersion medium in which electrophoretic particles are dispersed, EL (Electroluminescence) elements, active matrix display devices provided with electron emission elements for emitting light by directing electrons generated by application of an electric field to an emission substrate, and the like.

The present invention is also an electronic appliance comprising a semiconductor device manufactured according to the semiconductor device manufacturing method of the present invention.

As used herein, "electronic appliance" refers to a general apparatus for achieving a specific function, comprising the semiconductor device of the present invention; and is structured from, for example, an electro-optical device and memory provided therein. The configuration thereof is not particularly limited, and may comprise an IC card, portable telephone, video camera, personal computer, head mount display, rear or front projector, a fax device further equipped with display functionality, digital camera viewfinder, portable TV, DSP device, PDA, electronic notebook, electric signboard, advertising display, or the like.

BRIEF DESCRIPTION OF THE DRAWINGS

FIG. 16 depicts examples of the electronic appliance in embodiment 9, wherein

DESCRIPTION OF THE PREFERRED EMBODIMENTS

Embodiments of the present invention will be described hereafter with reference to the figures.

(Embodiment 1)

Embodiment 1 of the present invention employs the semiconductor thin-film manufacturing method of the abovementioned method 1. Cross-sectional diagrams illustrating the semiconductor thin-film manufacturing method of embodiment 1 are shown in FIGS. 1A through 1D.

Figure 1A:
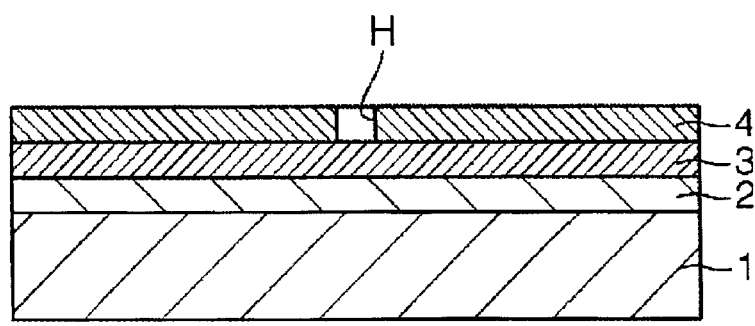
FIGS. 1A through 1D are cross-sectional diagrams illustrating the semiconductor device manufacturing method in embodiment 1 of the present invention; and are process charts (corresponding to a cross-section at line B—B in FIG. 2) depicting the steps following the laser irradiation step up to the crystal growth process.

A silicon oxide film (first insulating film) 2 is first formed on a glass substrate 1, as depicted in FIG. 1A. Methods for forming the silicon oxide film 2 on the glass substrate 1 include vapor deposition methods such as Plasma Enhanced Chemical Vapor Deposition (PECVD), Low Pressure Chemical Vapor Deposition (LPCVD), sputtering, and the like. A silicon oxide film 2 having a thickness of 100 nm can be formed by means of the PECVD method, for example.

A first amorphous silicon film 3 is then formed on the silicon oxide film 2. Methods that can be employed to form the first amorphous silicon film 3 on the silicon oxide film 2 include PECVD, LPCVD, Atmospheric Pressure Chemical Vapor Deposition (APCVD), and sputtering. A first amorphous silicon film 3 having a thickness of 50 nm can be formed by means of the LPCVD method, for example.

A silicon oxide film (second insulating film) 4 is then formed on the first amorphous silicon film 3. The silicon oxide film 4 may be fabricated according to the same manufacturing process as the silicon oxide film 2. A silicon oxide film 4 having a thickness of 500 nm can be formed by means of the PECVD method, for example.

A through-hole H is then formed at a prescribed location in the silicon oxide film 4. A circular through-hole H whose circular cross-section has a diameter of 0.5 $\mu$m can be formed at a prescribed location within the surface of the silicon oxide film 4 by photolithography and etching, for example. Etching methods can be carried out by means of reactive ion etching that uses plasma of $CF_4$ gas and $H_2$ gas, for example.

Figure 1B:
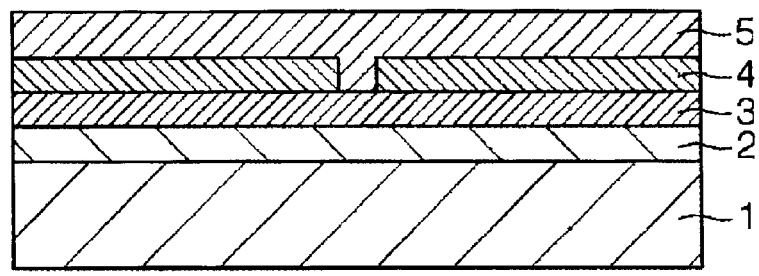

An amorphous silicon film 5 is then formed inside the through-hole H in the silicon oxide film 4, as depicted in FIG. 1B. A second amorphous silicon film 5 having a prescribed thickness ranging from 50–500 nm can be formed on the silicon oxide film 4 and within the through-hole H by LPCVD, for example. The amorphous silicon film 5 is preferably formed by LPCVD, so as to easily and reliably deposit a high-purity silicon film within the through-hole H.

Figure 1C:
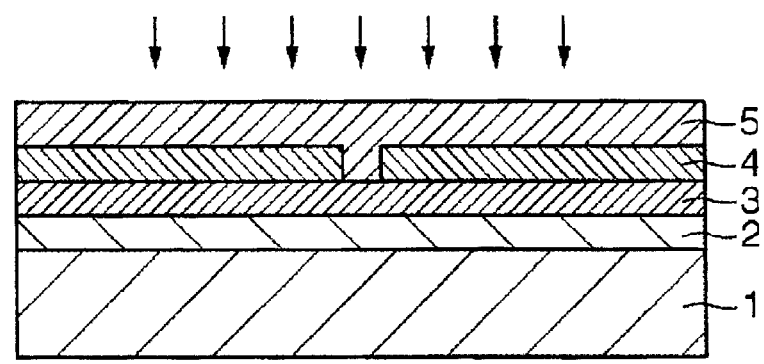

The second amorphous silicon film 5 is then partially melted by irradiating a laser thereon, as depicted in FIG. 1C. Partial melting can be achieved by irradiation with a XeCl pulse excimer laser (wavelength: 308 nm, pulse duration: 30 nsec) at an energy density of 0.4–1.5 J/cm$^2$ (corresponding to an amorphous silicon film 5 thickness of 50–500 nm, and preferably 50–250 nm.

In this step, the irradiated XeCl pulse excimer laser is almost completely absorbed near the surface of the amorphous silicon film 5. This is because the absorption coefficients of the amorphous silicon and crystalline silicon for the wavelength (308 nm) of the XeCl pulse excimer laser are large, each being 0.139 nm$^{-1}$ and 0.149 nm$^{-1}$, respectively. Also, the silicon oxide film 4 is substantially transparent with respect to laser, and is not melted by the laser irradiation because of the resultant lack of laser energy absorption therein.

By this means, the second amorphous silicon film 5 reaches a completely-melted state, and the first amorphous silicon film 3 reaches a partially melted state. As a result, the solidification of silicon following laser irradiation begins first with the first amorphous silicon film 3 and proceeds via the through-hole H in the silicon oxide film 4 towards the completely-melted second amorphous silicon film 5. Crystal grains that have passed via the through-hole H in the silicon oxide film 4 thus act as nuclei for crystal formation during solidification of the completely-melted second amorphous silicon film 5.

Figure 1D:
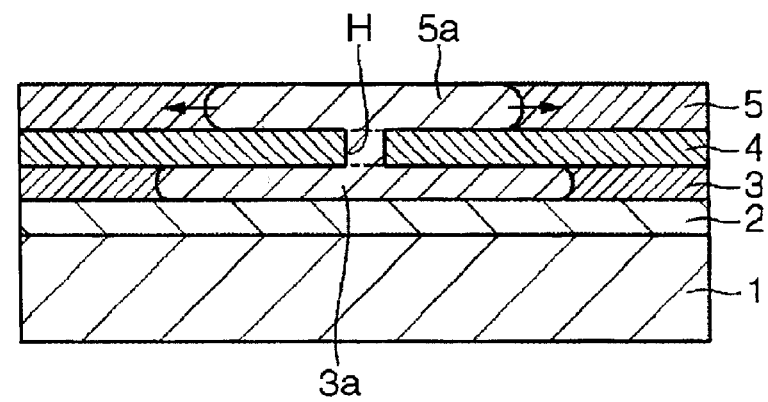

Consequently, crystal formation with a single crystal grain as nucleus is induced via the through-hole H towards the second amorphous silicon film 5, wherein one of among a plurality of crystal grains that form a substantially polycrystalline silicon film 3a acts as the nucleus thereof, by making the cross-sectional dimensions of the through-hole H the same or slightly smaller than the size of a single crystal grain of the plurality of crystal grains (substantially polycrystalline silicon film 3a) generated in the first amorphous silicon film 3 by laser irradiation. By this means, an area in the surface of the second amorphous silicon film 5 centered around the through-hole H forms a substantially monocrystalline silicon film 5a. FIG. 1D depicts this configuration.

Few defects exist within this substantially monocrystalline silicon film 5a, and effects are obtained with respect to the semiconductor film electrical properties thereof such that the trap density near the mid gap of the forbidden bands in the energy bands is reduced. Effects are also obtained such that barriers to the flow of carriers such as electrons and holes are greatly reduced due to the absence of grain boundaries. When this silicon film 5a is used in the active layer (source/drain area and channel formation area) of a thin-film transistor, a high-grade transistor is obtained having a low off-current value and high mobility.

Figure 2:
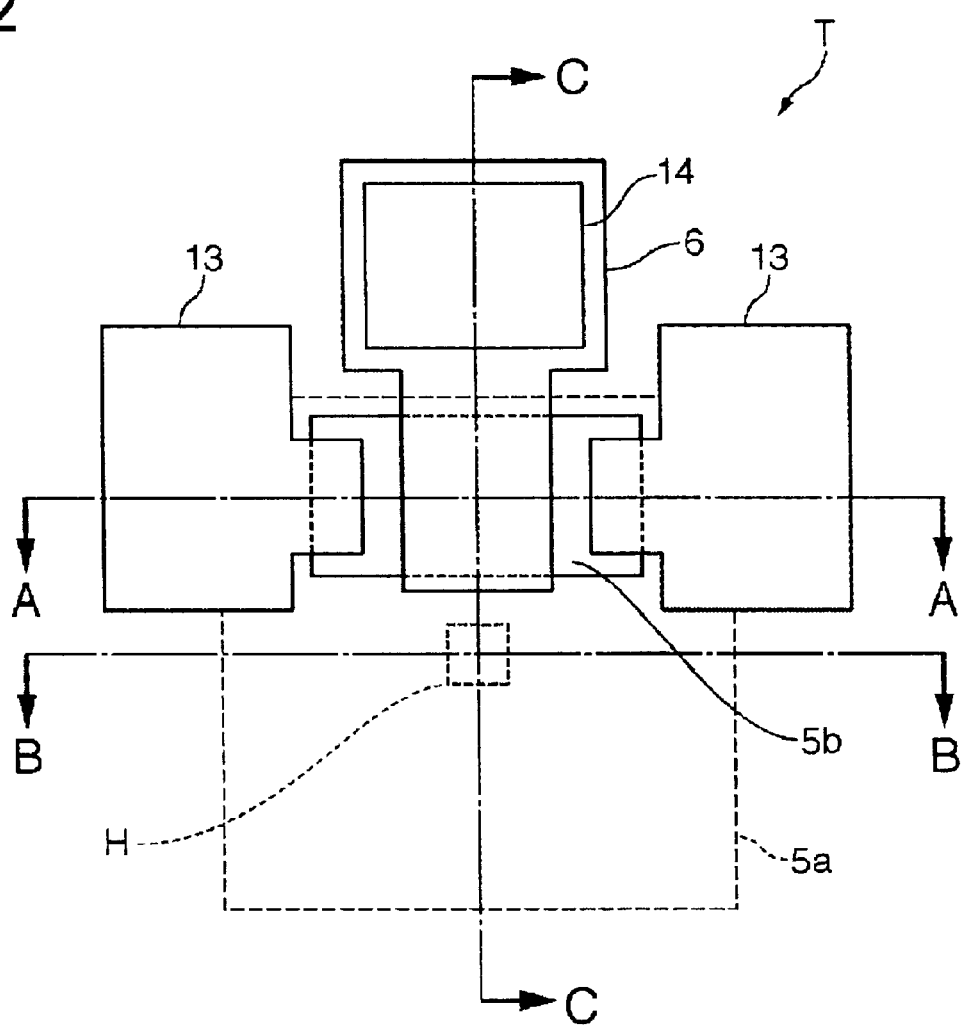
FIG. 2 is a plan view depicting an example of a thin-film transistor manufactured according to the semiconductor device manufacturing method of the present invention.

A thin-film transistor T is then formed according to the following process. FIG. 2 is a plan view of a semiconductor device (thin-film transistor) manufactured in the present embodiment; and FIGS. 3A through 3D are cross-sectional diagrams corresponding to a cross-section at line A—A in FIG. 2. In addition, FIGS. 1A through 1D are cross-sectional diagrams corresponding to a cross-section at line B—B in FIG. 2.

Figure 3A:
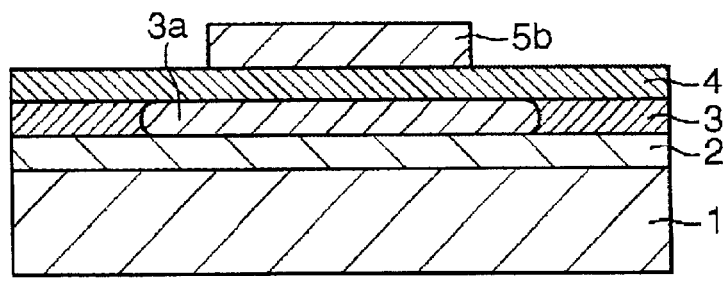
FIGS. 3A through 3D are cross-sectional diagrams (corresponding to a cross-section at line A—A in FIG. 2) illustrating the semiconductor device manufacturing method in embodiment 1 of the present invention.

A silicon film containing the substantially monocrystalline silicon film 5a is first patterned, and a semiconductor region (semiconductor film) 5b used for a thin-film transistor T is formed as depicted in FIG. 3A. In this step, it is preferable to allocate the portion not containing the through-hole H in the surface of the substantially monocrystalline silicon film 5a as depicted in FIG. 2 to the channel formation area 8 of the thin-film transistor T. This is because the crystal properties thereof are more stable farther away from the through-hole.

Figure 3B:
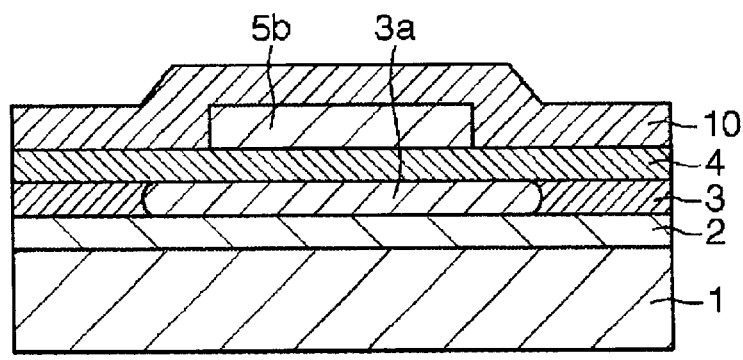

A silicon oxide film 10 is then formed on the silicon oxide film 4 and the silicon film 5a, as depicted in FIG. 3B. The silicon oxide film 10 can be formed according to the electron cyclotron resonance PECVD method (ECR-CVD method) or the PECVD method, for example. This silicon oxide film 10 functions as a gate insulating film for a thin-film transistor.

Figure 3C:
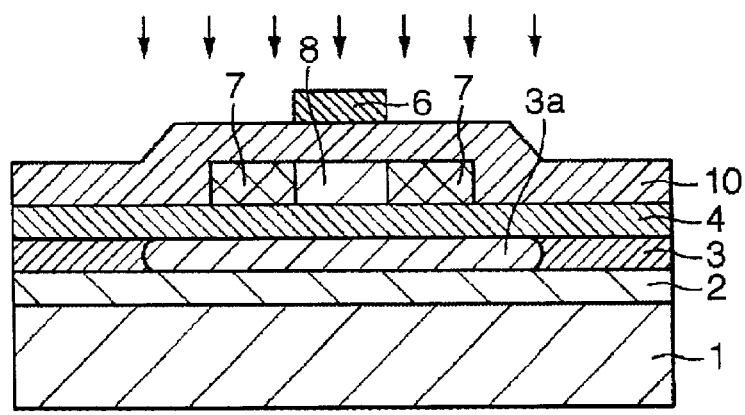

A gate electrode 6 is then formed by patterning after forming a tantalum or aluminum metallic thin-film by sputtering, as depicted in FIG. 3C. Impurity ions acting as donors or acceptors are then introduced using this gate electrode 6 as a mask, and the source/drain area 7 and channel formation area 8 are made self-aligning with respect to the gate electrode 6.

In manufacturing an NMOS transistor, for example, phosphorus (P) as an impurity element is introduced into the source/drain area at a concentration of $1 \times 10^{16}$ cm$^{-2}$. The impurity element is subsequently activated by irradiation with a XeCl excimer laser at an irradiation energy density of approximately 400 mJ/cm$^2$, or by heat treating at approximately 250–450° C.

Figure 3D:
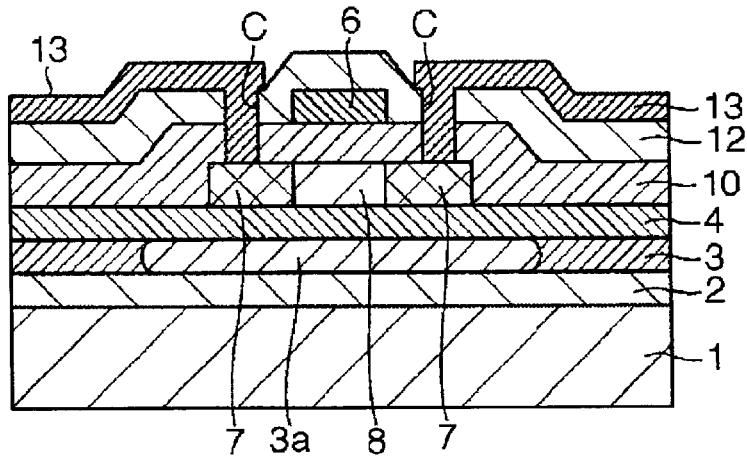

A silicon oxide film 12 is then formed on the upper surface of the silicon oxide film 10 and the gate electrode 6, as depicted in FIG. 3D. A silicon oxide film 9 of approximately 500 nm is formed by the PECVD method, for example. A contact hole C leading to the source/drain area 7 is then opened in the silicon oxide films 10 and 12, and aluminum is deposited in the contact hole C and in the rim of the contact hole C on the silicon oxide film 12 to form a source/drain area 13. Meanwhile, a contact hole leading to the gate electrode 6 is opened in the silicon oxide film 12 to form a terminal electrode 14 (see FIG. 2) used for the gate electrode 6. A thin-film transistor T as the semiconductor device of the present invention can thus be manufactured.

In the present first embodiment as described above, the cross-sectional size of the through-hole H may be equal to or slightly less than a single crystal grain of the polycrystal that forms the first amorphous silicon film 3; and the thickness of the silicon oxide film 4 in which the through-hole H is opened may be approximately the same as the cross-sectional size of the through-hole H. Specifically, the cross-sectional size of the through-hole H can be enlarged beyond the size of a hole formed according to the conventional method.

There is, therefore, no need to utilize costly precision exposure devices and etching devices in hole formation (through-hole) for growing a monocrystal in the same manner as in the conventional method. Because of this, favorable properties can be obtained reliably even when forming multiple thin-film transistors on a large glass substrate that exceeds 300 mm square, for example.

Strains and defects also tend to occur in the through-hole H portions within the surface of the substantially monocrystalline silicon film 5a because the direction of growth for the monocrystal changes from an upward direction to a sideways direction in the upper portion of the through-hole H in accordance with the present embodiment 1. In view of this, the thin-film transistor T is formed by utilizing the area not containing the through-hole H in the surface of the substantially monocrystalline silicon film 5a as the semiconductor thin film 5b in the method of this embodiment, rather than the aforementioned area in which deformities and flaws tend to occur, as depicted in FIG. 2.

As a result, an exceptionally high-performance transistor T having a smaller off-current value, steeper subthreshold characteristics (smaller subthreshold swing value), and higher mobility is obtained by means of the method of this embodiment than when the area containing the through-hole H in the surface of the substantially monocrystalline silicon film 5a is utilized as the channel formation area 8.

It is preferable to provide the semiconductor thin film at a separate location from the through-hole in the semiconductor device of the present invention; however, because patterning is performed for the semiconductor thin film of the semiconductor device after the substantially monocrystalline silicon film is formed, the through-hole and the semiconductor thin film are often not connected by the substantially monocrystalline silicon film in the completed semiconductor device. Specifically, the through-hole remains in the vicinity of the semiconductor device as a byproduct of semiconductor manufacturing.

Figure 4A:
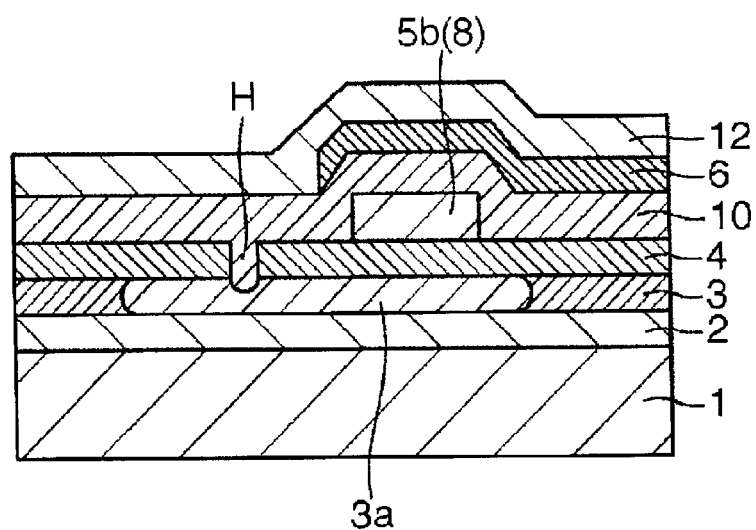
FIGS. 4A through 4C are cross-sectional diagrams (corresponding to a cross-section at line C—C in FIG. 2) depicting aspects of the substantially monocrystalline silicon remaining in the through-hole.

When, for example, the substantially monocrystalline silicon is etched down to the inside of the through-hole H and removed during etching of the substantially monocrystalline silicon film 5a, as depicted in FIG. 4A, the silicon fills inside the through-hole H by the silicon oxide film 10.

Figure 4B:
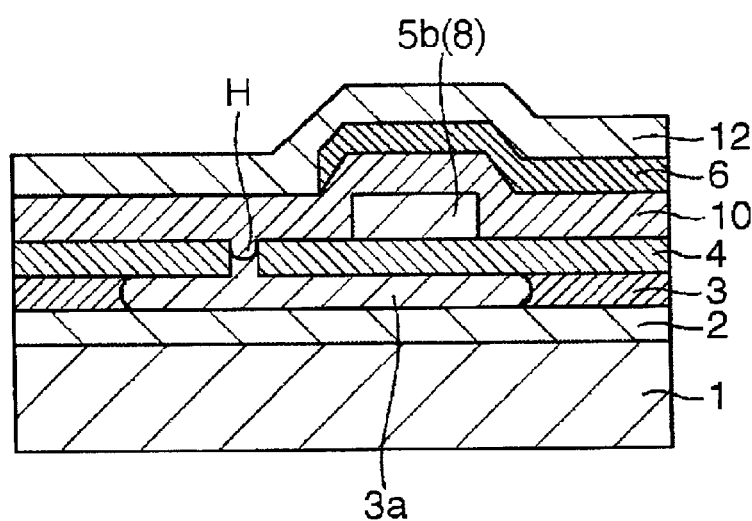

Some of the remaining substantially monocrystalline silicon packed inside the through-hole H may be filled by silicon oxide, as depicted in FIG. 4B, according to the etching strength of the substantially monocrystalline silicon film 5a.

Figure 4C:
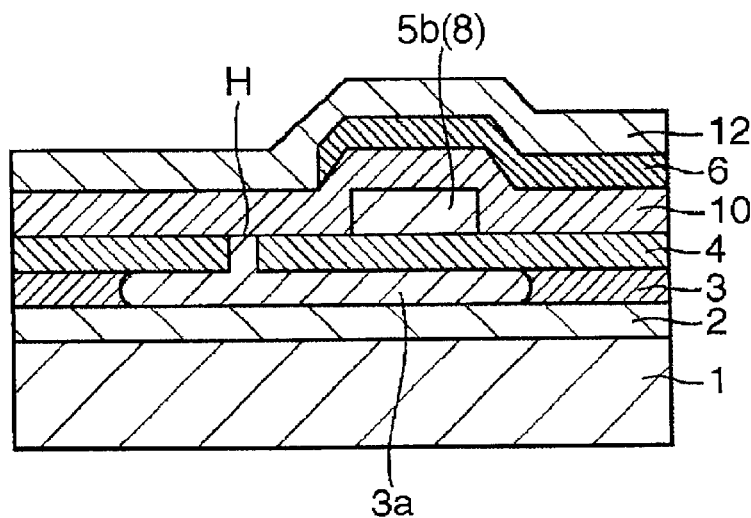

It is also possible according to the etching strength that the substantially monocrystalline silicon could be etched down to the surface of the second silicon oxide film just as if back-etched, such that the inside of the through-hole H is in a state similar to having been filled with substantially monocrystalline silicon, as further depicted in FIG. 4C.

The manner in which the substantially monocrystalline silicon thus remains inside the through-hole H may be determined according to subsequent etching processing and the like. This consideration also applies to the following embodiments.

(Embodiment 2)

Figure 5:
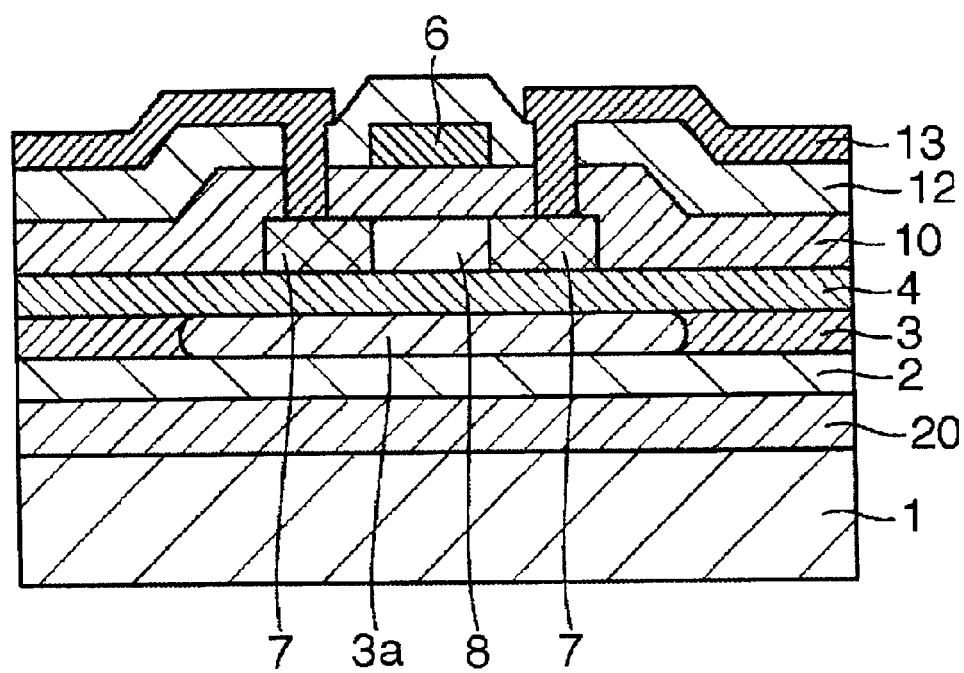
FIG. 5 is a cross-sectional diagram (corresponding to a cross-section at line A—A in FIG. 2) of a thin-film transistor manufactured according to the semiconductor device manufacturing method in embodiment 2 of the present invention.

A cross-sectional diagram of a thin-film transistor formed according to the semiconductor device manufacturing method of embodiment 2 of the present invention is depicted in FIG. 5.

The semiconductor device manufacturing method of the present embodiment 2 is fundamentally identical to the semiconductor thin-film and semiconductor device manufacturing method of embodiment 1. However, the method of embodiment 2 differs in that a silicon nitride film 20 is formed on a glass substrate 1 before the silicon oxide film 2 is formed on the glass substrate 1 in embodiment 1, as depicted in FIG. 1A.

Methods that can be employed to form the silicon nitride film 20 include PECVD, LPCVD, Atmospheric Pressure Chemical Vapor Deposition (APCVD), and sputtering. A silicon nitride film 20 having a thickness of 50 nm can be formed by LPCVD, for example. The silicon oxide film 2 is formed on the silicon nitride film 20 in the same manner as in embodiment 1, and a first amorphous silicon film 3 is formed on the silicon oxide film 2. Because the these film manufacturing methods and other manufacturing methods are identical to those of embodiment 1, description thereof is omitted. The film thickness of the silicon oxide film 2 may, for example, be 100 nm–10 $\mu$m, and preferably 100 nm–200 nm.

By means of the present embodiment 2 as described above, the insulating film shields the substrate from the heat generated during laser heat treatment even better than in the method of embodiment 1, yielding less heat damage to the substrate in addition to achieving the same effects as embodiment 1, because the insulating film directly above the glass substrate 1 has a dual-layered composition comprising the silicon nitride film 20 and the silicon oxide film 2.

When the glass substrate contains impurities that are undesirable for a semiconductor film, such sodium, aluminum, boron, and the like, new effects are achieved such that the diffusion of these impurities from the substrate into the semiconductor film is effectively prevented by providing a dual-layered composition to the insulating layer above the substrate.

Furthermore, the risk increases of the substrate sustaining extensive heat damage because the laser heat treatment is carried out in the present invention under conditions in which the second amorphous silicon film is completely melted; however, this heat damage is reduced by means of the present embodiment 2 by providing a dual-layered composition to the insulating layer above the substrate. This heat damage-reducing effect and the aforementioned impurity diffusion-preventing effect yield a thin-film transistor having exceptional characteristics.

Even furthermore, it is preferable with regard to silicon crystal growth on the second insulating film to make the surface of the second insulating film flat, such that crystal nuclei do not form in the melted amorphous silicon film in the present invention. The surface flatness of silicon oxide film is better than that of silicon nitride film when comparing silicon oxide film to silicon nitride film. Because of this, effects are achieved such that crystals are less likely to form in the melted amorphous silicon film, because a silicon oxide film having good surface flatness is formed as a first insulating film, and a silicon nitride film between the first insulating film and the substrate is formed as a second insulating film in the present second embodiment.

(Embodiment 3)

Embodiment 3 of the present invention employs the semiconductor thin-film manufacturing method of the abovementioned method 2. Cross-sectional diagrams illustrating the semiconductor thin-film manufacturing method of embodiment 3 of the present invention are shown in FIGS. 6A through 6D.

Figure 6A:
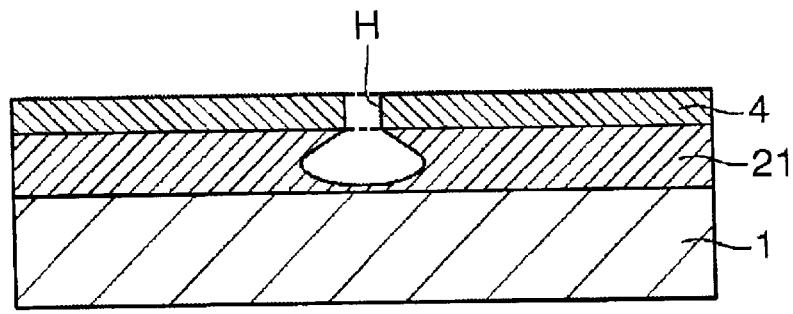
FIGS. 6A through 6D are cross-sectional diagrams illustrating the semiconductor device manufacturing method in embodiment 3 of the present invention; and are process charts (corresponding to a cross-section at line B—B in FIG. 2) depicting the steps following the laser irradiation step up to the crystal growth process.

A silicon nitride film (first insulating film) 21 is first formed on a glass substrate 1, as depicted in FIG. 6A. A silicon nitride film 21 having a thickness of 2 $\mu$m can be formed by PECVD, for example. A silicon oxide film 4 is then formed on the silicon nitride film 21. A silicon oxide film 4 having a thickness of 500 nm can be formed by PECVD, for example.

A photoresist film is then formed on the silicon oxide film 4 in this state, a resist pattern having a through-hole at a prescribed location is formed by photolithography, a through-hole H is first opened at a prescribed location in the surface of the silicon oxide film 4 by dry etching with the resist pattern as a mask, and a concave portion 22 is subsequently formed in the silicon nitride film 21 therebelow.

Etching for opening the through-hole H in the silicon oxide film 4 may be performed in the same manner as in embodiment 1. Etching can be performed by a RIE (Reactive Ion Etching) method using $CF_4$ as an etching gas, for example. Etching for forming the concave portion 22 in the silicon nitride film 21 can be performed by a CDE (Chemical Dry Etching) method using $NF_3$ and $Cl_2$ as etching gases, for example. The through-hole H may be designed in a substantially uniform columnar shape having a cross-sectional circular diameter of 0.5 $\mu$m; and the cross-sectional surface of the concave portion 22 can be designed to gradually enlarge from directly below the through-hole H, such that the cross-sectional circular diameter of the bottom part is larger (about three times larger, for example) than the cross-sectional circular diameter of the through-hole H. FIG. 6A depicts this configuration.

Figure 6B:
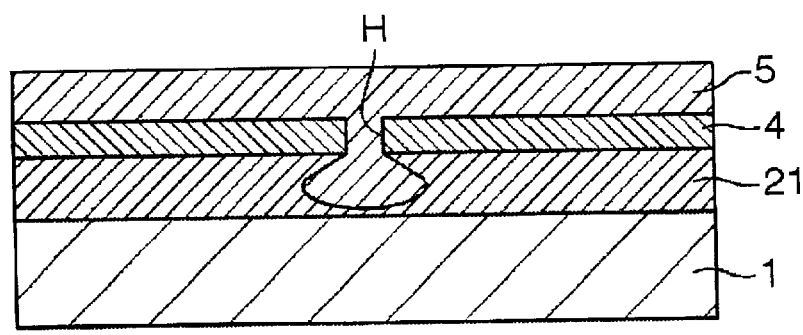

An amorphous silicon film 5 is then formed on the silicon oxide film 4 by depositing amorphous silicon on the silicon oxide film 4 and in the through-hole H and concave portion 22, as depicted in FIG. 6B. The amorphous silicon film 5 is thus formed. It is preferable to use the LPCVD method for the amorphous silicon film 5, because high-purity silicon can thus be deposited easily and reliably within the through-hole H and concave portion 22. The amorphous silicon film 5 can thus be formed at a prescribed thickness ranging, for example, from 50 nm–500 nm, and preferably 50 nm–250 nm.

Figure 6C:
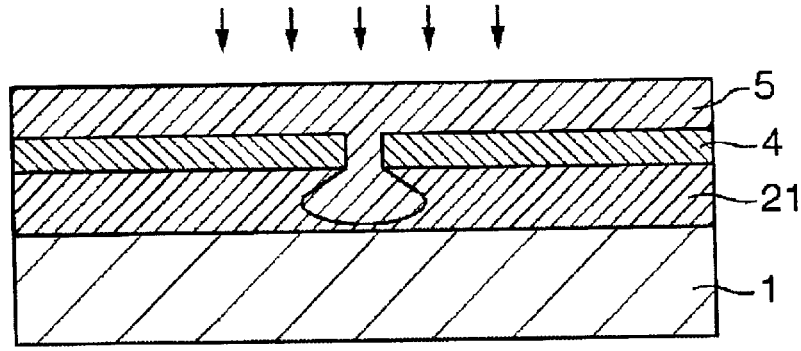

The amorphous silicon film 5 is then irradiated with a laser to induce melting thereof in the same manner as in embodiment 1, as depicted in FIG. 6C. Laser irradiation may be performed using a XeCl pulse excimer laser (wavelength of 308 nm, pulse duration of 30 nsec) at an energy density of 0.4–1.5 $J/cm^2$ (corresponding to an amorphous silicon film 5 thickness of 50 nm–500 nm), for example.

By this means, the amorphous silicon film 5 reaches a completely-melted state, and the amorphous silicon in the concave portion 22 reaches a partially melted state. As a result, the solidification of silicon following laser irradiation begins first with the amorphous silicon in the concave portion 22 and proceeds via the through-hole H in the silicon oxide film 4 towards the completely-melted amorphous silicon film 5a. Crystal grains that have passed via the through-hole H in the silicon oxide film 4 thus act as nuclei for crystal formation during solidification of the completely-melted second amorphous silicon film 5a.

Figure 6D:
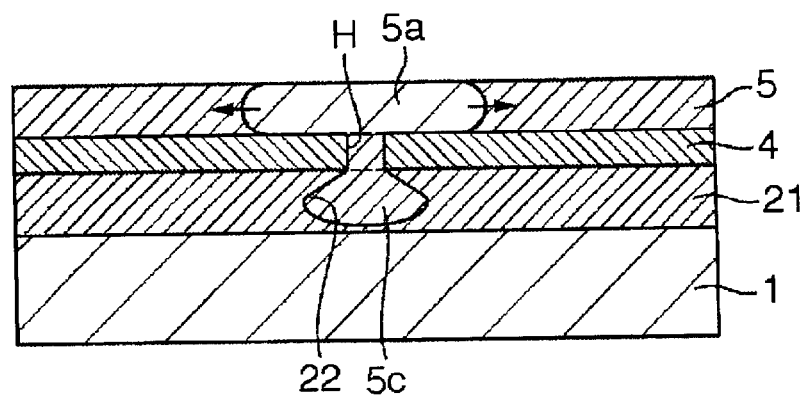

Consequently, crystal formation with a single crystal grain as nucleus is caused to occur via the through-hole H towards the second amorphous silicon film 5, wherein one of among a plurality of crystal grains that form substantially polycrystalline silicon acts as the nucleus thereof, by making the cross-sectional dimensions of the through-hole H the same or slightly smaller than the size of a single crystal grain of the plurality of crystal grains (substantially polycrystalline silicon 5c) generated in the amorphous silicon within the concave portion 22. By this means, an area in the surface of the amorphous silicon film 5 centered around the through-hole H forms a substantially monocrystalline silicon film 5a. FIG. 6D depicts this configuration.

Figure 7:
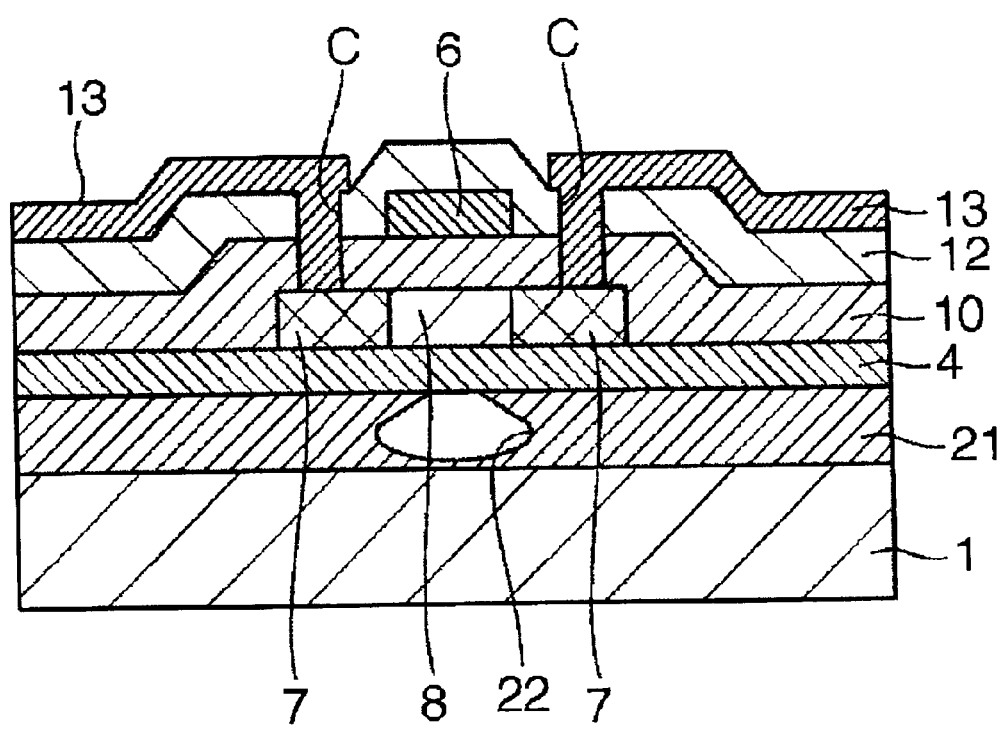
FIG. 7 is a cross-sectional diagram (corresponding to a cross-section at line A—A in FIG. 2) of a thin-film transistor manufactured according to the semiconductor device manufacturing method in embodiment 3 of the present invention.

A thin-film transistor can be manufactured according to the same method as the semiconductor device manufacturing method of embodiment 1 using this silicon film 5a. FIG. 7 depicts a cross-sectional diagram of a thin-film transistor formed by this semiconductor device manufacturing method.

The concave portion 22 is depicted in a location directly below the thin-film transistor in FIG. 7 for the sake of simplicity, but the concave portion 22 is not limited to being located directly below the thin-film transistor, and may be provided at any location.

The same effects as in embodiment 1 are achieved by means of embodiment 3 described above. Specifically, few defects exist within this substantially monocrystalline silicon film 5a, and the trap density near the mid gap of the forbidden bands in the energy bands is reduced if the electrical properties of the semiconductor film are taken into account. Barriers to the flow of carriers such as electrons and holes can also be greatly reduced due to the absence of grain boundaries. When this silicon film 5a is used in the active layer (source/drain area and channel formation area) of a thin-film transistor, a high-grade transistor is obtained having a low off-current value and high mobility.

Specifically, this thin-film transistor has a small off-current value, steeper subthreshold characteristics (smaller subthreshold swing value), higher mobility, and exceptionally high-performance.

In the present embodiment 3, the cross-sectional size of the through-hole H may be the same size as or slightly smaller than the size of a single crystal grain of the polycrystal formed in the amorphous silicon within the concave portion 22; and the thickness of the silicon oxide film 4 in which the through-hole H is opened may also be approximately the same as the cross-sectional size of the through-hole H. Specifically, the cross-sectional size of the through-hole H can be enlarged beyond the size of a hole formed according to the conventional method.

There is, therefore, no need to utilize costly precision exposure devices and etching devices in hole (through-hole and concave portion) formation for growing a monocrystal in the same manner as in the conventional method. Because of this, favorable properties can be obtained reliably even when forming multiple thin-film transistors on a large glass substrate that exceeds 300 mm square, for example.

Also by means of the present embodiment 3, manufacturing costs can be reduced even further than in the method of embodiment 1, due to the fact that the amorphous silicon film formation process is performed only once.

(Embodiment 4)

Embodiment 4 of the present invention employs the semiconductor thin-film manufacturing method of the abovementioned third method. Cross-sectional diagrams illustrating the semiconductor thin-film manufacturing method of embodiment 4 of the present invention are shown in FIGS. 8A–8D.

Figure 8A:
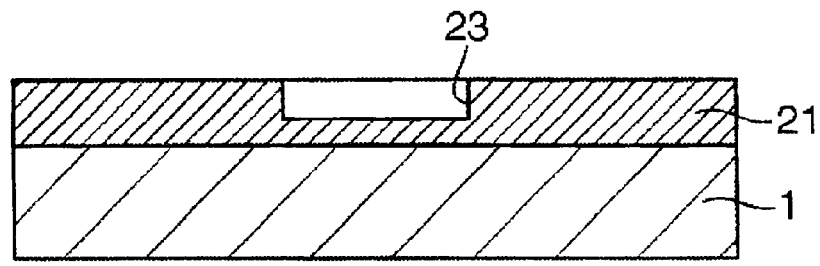
FIGS. 8A through 8E are cross-sectional diagrams illustrating the semiconductor thin-film manufacturing method in embodiment 4 of the present invention; and are process charts (corresponding to a cross-section at line B—B in FIG. 2) depicting the steps up to the step of amorphous silicon film formation on the second insulating film.

A silicon nitride film (first insulating film) 21 is first formed on a glass substrate 1, as depicted in FIG. 8A. The silicon nitride film 21 is formed by the same method as in embodiment 3. A silicon nitride film 21 having a thickness of 300 nm can be formed by PECVD, for example. A concave portion 23 is then formed at a prescribed location within the surface of the silicon nitride film 21 by photolithography and etching. The cross-section of the concave portion 23 can, for example, be a circular cylinder with a circular cross-sectional diameter of 3 $\mu$m and a depth of 100 nm.

Figure 8B:
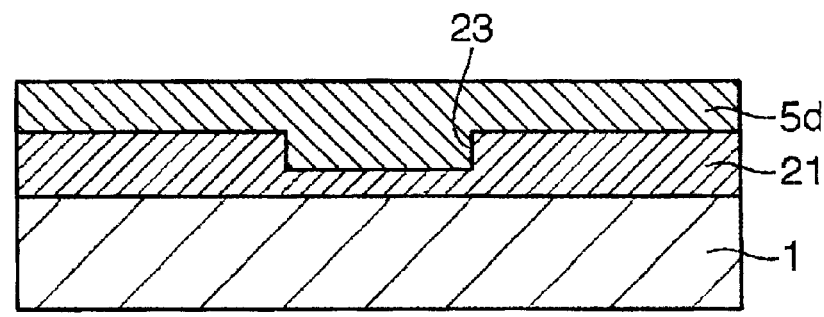

An amorphous silicon film 5d is then formed on the silicon nitride film 21, as depicted in FIG. 8B. The amorphous silicon film 5d can be formed by LPCVD, for example. Formation of the amorphous silicon film 5d is performed until amorphous silicon is deposited throughout the inside of the concave portion 23, and until amorphous silicon is deposited on the surrounding film surface of the concave portion 23 of the silicon nitride film 21.

Figure 8C:
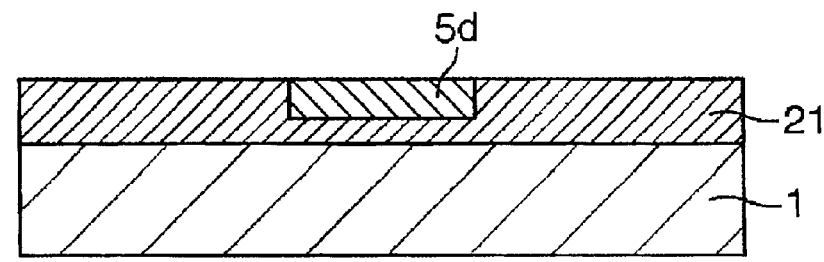

The amorphous silicon film 5d is then etched as depicted in FIG. 8C, leaving only the amorphous silicon film 5d within the concave portion 23 of the silicon nitride film 21 and exposing the surface of the silicon nitride film 21 other than that of the concave portion 23. The amorphous silicon film 5d formed in the concave portion 23 is partially melted by means of subsequent laser irradiation, and is converted to polycrystalline silicon.

Figure 8D:
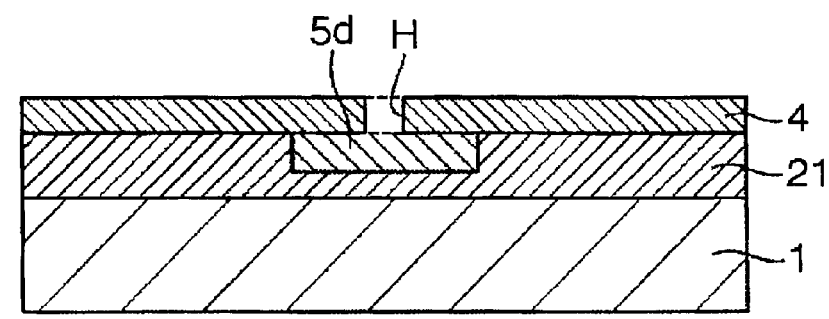

A silicon oxide film 4 is then formed on the silicon nitride film 21, as depicted in FIG. 8D. A silicon oxide film 4 having a thickness of 500 nm is formed by the same method as in the aforementioned first embodiment, for example. A through-hole H is then formed in the portion corresponding to the concave portion 23 of the silicon oxide film 4. A through-hole H having a cross-sectional circular diameter of 0.5 μm can be formed in the center of the concave portion 23 within the surface of the silicon oxide film 4 by photolithography and etching, for example.

Figure 8E:
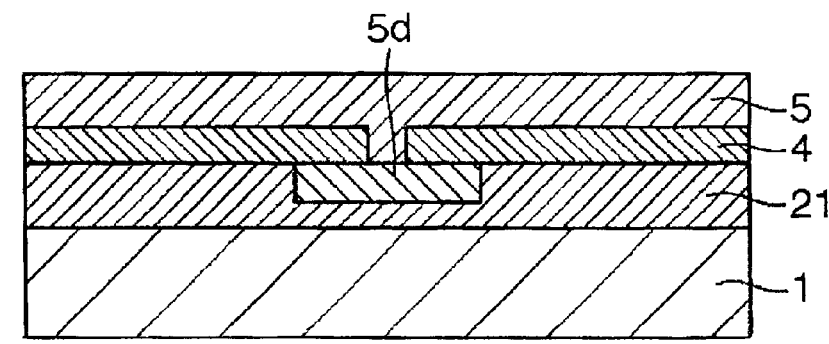

An amorphous silicon film 5 is then formed on the silicon oxide film 4 and inside the through-hole H, as depicted in FIG. 8E. An amorphous silicon film 5 having a prescribed thickness ranging from 50 nm–500 nm, and preferably from 50 nm–250 nm, can be formed on the silicon oxide film 4 by the LPCVD method, as in embodiment 1, for example.

The amorphous silicon film is then partially melted by irradiating a laser on the amorphous silicon film 5 according to the same method as in the aforementioned embodiment 3. As a result, the amorphous silicon film 5d within the concave portion 23 partially melts and polycrystallizes, crystal growth is induced from a single crystal grain of this polycrystal, and a substantially monocrystalline silicon film can thus be formed.

Figure 9:
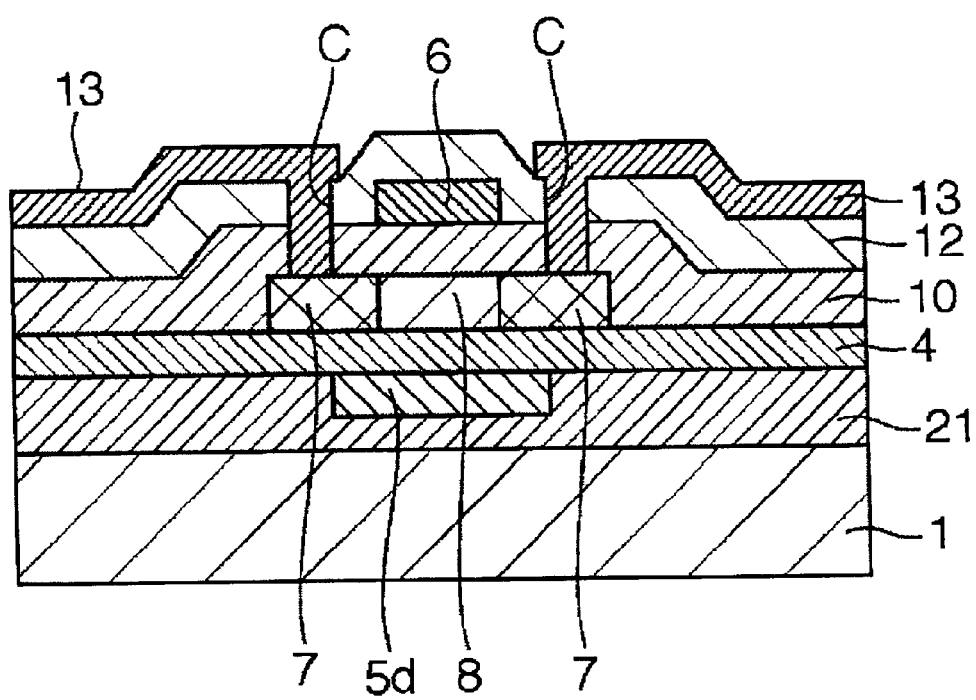
FIG. 9 is a cross-sectional diagram (corresponding to a cross-section at line A—A in FIG. 2) of a thin-film transistor manufactured according to the semiconductor device manufacturing method in embodiment 4 of the present invention.

A thin-film transistor can be manufactured using this substantially monocrystalline silicon film by the same method as the semiconductor device manufacturing method of embodiment 1. FIG. 9 shows a cross-sectional diagram of a thin-film transistor formed according to this semiconductor device manufacturing method.

The concave portion 23 is depicted in a location directly below the thin-film transistor in FIG. 9 for the sake of simplicity, but the concave portion 23 is not limited to being located directly below the thin-film transistor, and may be provided at any location.

The same effects as in embodiment 3 are achieved by means of embodiment 4 described above. Specifically, few defects exist within the substantially monocrystalline silicon film, and the trap density near the mid gap of the forbidden bands in the energy bands is reduced if the electrical properties of the semiconductor film are taken into account. Barriers to the flow of carriers such as electrons and holes can also be greatly reduced due to the absence of grain boundaries. When this silicon film is used in the active layer (source/drain area and channel formation area) of a thin-film transistor, a transistor T is obtained having a small off-current value, steep subthreshold characteristics (smaller subthreshold swing value), high mobility, and exceptionally high-performance.

In the present embodiment 4, the cross-sectional size of the through-hole H may be the same size as or slightly smaller than the size of a single crystal grain of the polycrystal formed in the amorphous silicon within the concave portion 23; and the thickness of the silicon oxide film 4 in which the through-hole H is opened may also be approximately the same as the cross-sectional size of the through-hole H. Specifically, the cross-sectional size of the through-hole H can be enlarged beyond the size of a hole formed according to the conventional method.

As a result, there is no need to utilize costly precision exposure devices and etching devices in hole (through-hole and concave portion) formation for growing a monocrystal in the same manner as in the conventional method. Because of this, favorable properties can be obtained reliably even when forming multiple thin-film transistors on a large glass substrate that exceeds 300 mm square, for example.

By means of the present embodiment 4, the shape of the concave portion formed in the first insulating film is also even easier to control than in the aforementioned embodiment 3, yielding the advantage of being able to easily deposit amorphous silicon in the concave portion.

(Embodiment 5)

Embodiment 5 of the present invention employs the semiconductor thin-film manufacturing method of the abovementioned method 4. Cross-sectional diagrams illustrating the semiconductor thin-film manufacturing method of embodiment 5 of the present invention are shown in FIGS. 10A–10E.

The manufacturing method of the present embodiment may be substantially identical to that of the aforementioned first embodiment.

Figure 10A:
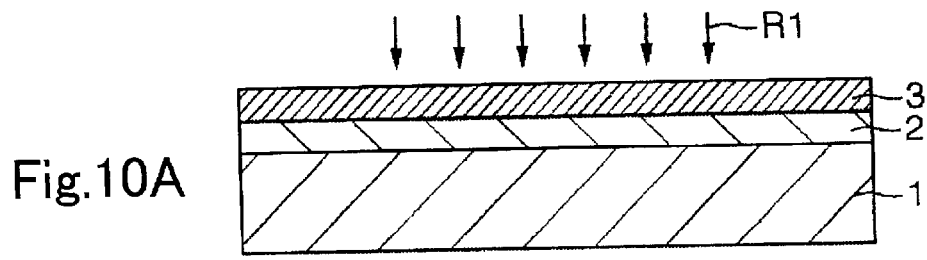
FIGS. 10A through 10E are cross-sectional diagrams (corresponding to a cross-section at line B—B in FIG. 2) depicting the semiconductor thin-film manufacturing steps in embodiment 5 of the present invention.

A silicon oxide film 2 is first formed on a glass substrate 1, as depicted in FIG. 10A. Examples of methods for forming the silicon oxide film 2 on the glass substrate 1 include Plasma Enhanced Chemical Vapor Deposition (PECVD), Low Pressure Chemical Vapor Deposition (LPCVD), sputtering, and other vapor-phase deposition techniques. A silicon oxide film 2 having a thickness of 200 fin can be formed by PECVD, for example.

An amorphous silicon film 3 is then formed on the silicon oxide film 2. Methods that can be employed to form the amorphous silicon film 3 on the silicon oxide film 2 include PECVD, LPCVD, Atmospheric Pressure Chemical Vapor Deposition (APCVD), sputtering, and the like. An amorphous silicon film 3 having a thickness of 50 nm can be formed by LPCVD, for example.

Furthermore, the amorphous silicon film 3 is converted to a polycrystalline silicon film 3b by performing laser irradiation R1 on the amorphous silicon film 3. Laser irradiation is performed using XeCl pulse excimer laser (wavelength: 308 nm, pulse duration: 30 nsec) having an energy density from approximately 0.3 J/cm$^2$ to 0.5 J/cm$^2$. Laser irradiation R1 may also be performed approximately 20 times for the same location on the amorphous silicon film 3.

Specifically, the amorphous silicon film 3 can be converted to a polycrystalline silicon film 3b having a crystal orientation (111) within the film surface thereof by performing laser irradiation R1 repeatedly in the same location, as described in "Laser Processing of Amorphous Silicon for Large-area Polysilicon Imagers." (J. B. Boyce et al., *Thin Solid Films*, vol. 383 (2001) pp. 137–142).

Figure 10B:
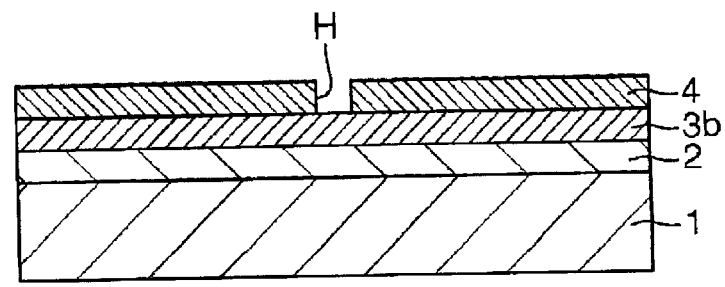
Figure 10C:
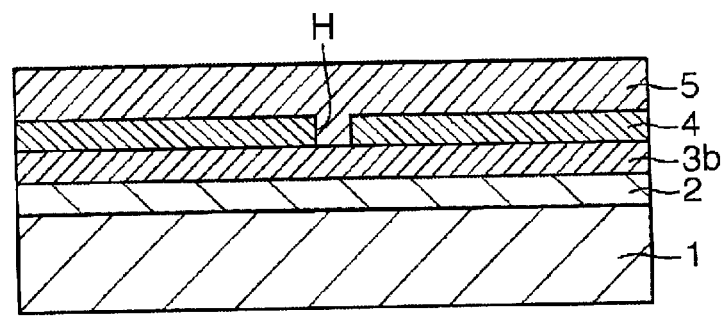

A silicon oxide film 4 is then formed on the polycrystalline silicon film 3b, as depicted in FIG. 10B. A silicon oxide film 4 having a thickness ranging from 500 nm to 2 μm can be formed on the polycrystalline silicon film 3b by PECVD, for example.

A through-hole H is then formed in the silicon oxide film 4. A substantially circular through-hole H whose cross-section has a diameter of approximately 50 nm to 500 nm can be formed at a prescribed location within the surface of the silicon oxide film 4 by photolithography and etching, for example. This etching can be performed by means of reactive ion etching that uses plasma of CF$_4$ gas and CHF$_3$ gas, for example.

An amorphous silicon film 5 is then formed on the silicon oxide film and inside the through-hole H, as depicted in FIG.

10C. An amorphous silicon film 5 having a prescribed thickness ranging from 50 nm–500 nm, and preferably from 50 nm–250 nm, can be deposited on the silicon oxide film 4 by LPCVD, for example, such that the through-hole H is filled up. By forming an amorphous silicon oxide film 4 using the LPCVD method, a high-purity amorphous silicon film 5 can easily be deposited on the silicon oxide film 4 while the amorphous silicon film 5 is reliably filled inside the through-hole H.

Figure 10D:
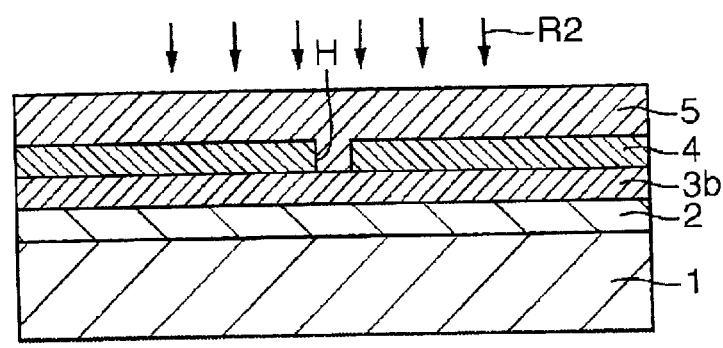

Laser irradiation R2 is then performed for the amorphous silicon film 5 deposited on the silicon oxide film 4, as depicted in FIG. 10D. For example, laser irradiation R2 is performed using XeCl pulse excimer laser (wavelength of 308 nm, pulse duration of 30 nsec) with an energy density from approximately 0.4 J/cm$^2$ to 1.5 J/cm$^2$ that is suitable for the amorphous silicon film 5 having a thickness of 50 nm to 500 nm, and preferably of 50 nm to 250 nm.

In this step, the XeCl pulse excimer laser irradiated to the amorphous silicon film 5 is almost completely absorbed near the surface of the amorphous silicon film 5. This is because the absorption coefficients of the amorphous silicon and crystalline silicon for the wavelength (308 nm) of the XeCl pulse excimer laser are large, each being 0.139 nm$^{-1}$ and 0.149 nm$^{-1}$, respectively.

By this means, the amorphous silicon film 5 can be brought to a completely-melted state while the polycrystalline silicon film 3b under the silicon oxide film 4 is preserved in the unmelted or partially melted state.

The solidification of the silicon following laser irradiation R2 can thus be directed to proceed first from the polycrystalline silicon film 3b, via the through-hole H of the silicon oxide film 4, and on to the completely-melted amorphous silicon film 5. Crystal growth then occurs in the completely-melted amorphous silicon film 5 at the time of solidification, with the crystal grains that have passed via the through-hole H of the silicon oxide film 4 acting as nuclei. Consequently, the crystal orientation of one of the numerous crystal grains contained in the polycrystalline silicon film 3b can be transferred to the amorphous silicon film 5 via the through-hole H, inducing crystal growth on the silicon oxide film 4, with this crystal grain acting as the nucleus thereof, by setting the cross-sectional dimensions of the through-hole H to be the same size or slightly smaller than one of the numerous crystal grains contained in the polycrystalline silicon film 3b.

Figure 10E:
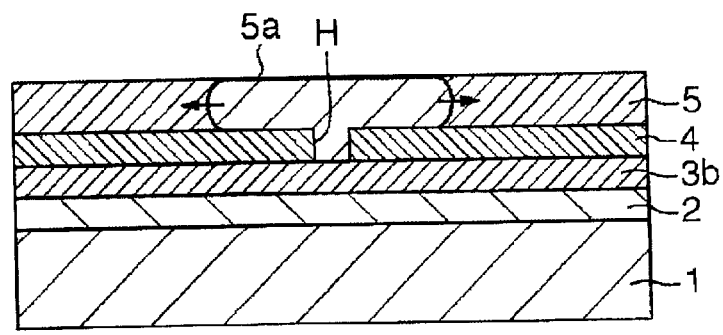

It is thus possible to form a substantially monocrystalline silicon film 5a having a coordinated crystal orientation in the area of the amorphous silicon film 5 centered around the through-hole H. as depicted in FIG. 10E.

Figure 11:
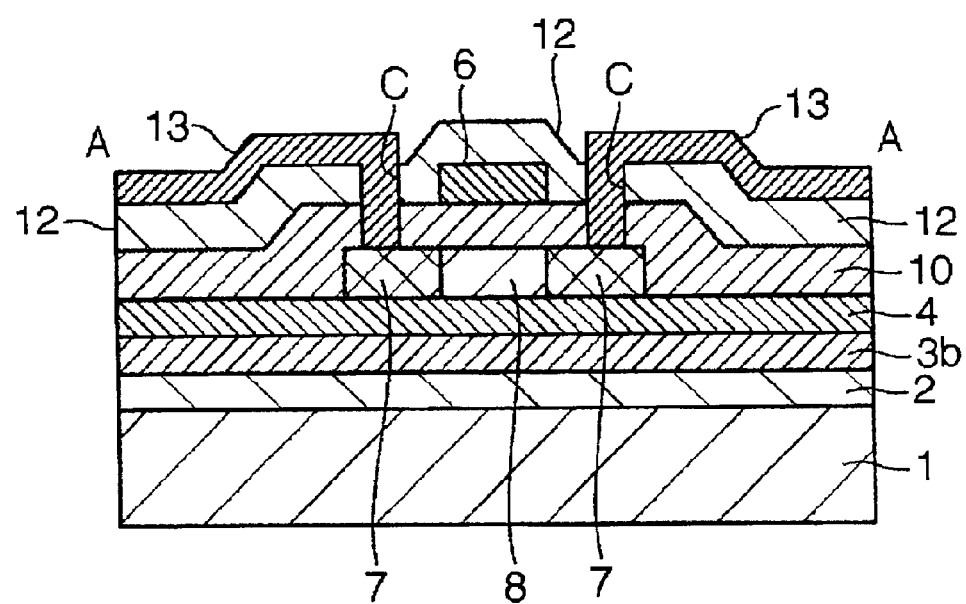
FIG. 11 is a cross-sectional diagram (corresponding to a cross-section at line A—A in FIG. 2) of a thin-film transistor manufactured according to the semiconductor device manufacturing method in embodiment 5 of the present invention.

A thin-film transistor can be manufactured using this silicon film 5a by the same method as the semiconductor device manufacturing method of embodiment 1. FIG. 11 shows a cross-sectional diagram of a thin-film transistor formed according to this semiconductor device manufacturing method.

The same effects as in embodiment 1 are achieved by means of embodiment 5 described above. Specifically, few defects exist within this substantially monocrystalline silicon film 5a, and the trap density near the mid gap of the forbidden bands in the energy bands is reduced if the electrical properties of the semiconductor film are taken into account. Barriers to the flow of carriers such as electrons and holes are also greatly reduced due to the absence of grain boundaries in this substantially monocrystalline silicon film 5a. By using this substantially monocrystalline silicon film 5a in the active layer (source/drain area and channel formation area) of a thin-film transistor, a high-grade transistor T having a small off-current value and high mobility can easily be obtained.

Before the silicon oxide film 4 is formed on the polycrystalline silicon film 3b, the polycrystalline silicon film 3b may be processed by photolithography or etching such that only portions thereof in the vicinity of the through-hole H are left remaining.

(Embodiment 6)

Embodiment 6 of the present invention relates to a modified example of the semiconductor thin-film manufacturing method of the above-mentioned method 4. Cross-sectional diagrams illustrating the semiconductor thin-film manufacturing method of embodiment 6 of the present invention are shown in FIGS. 12A through 12E.

The present embodiment 6 is substantially identical to the aforementioned embodiment 5. However, the present embodiment differs from embodiment 5, in that after the amorphous silicon film 3 is converted to a polycrystalline silicon film 3b, the silicon oxide film 4 is provided after the polycrystalline silicon film 3b has been patterned in a prescribed shape.

Figure 12A:
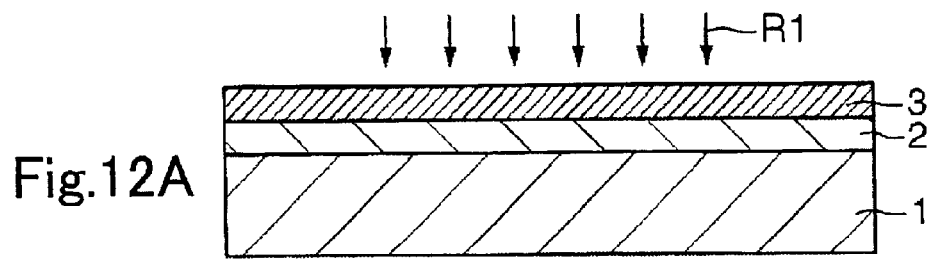
FIGS. 12A through 12E are cross-sectional diagrams (corresponding to a cross-section at line B—B in FIG. 2) depicting the semiconductor thin-film manufacturing steps in embodiment 6 of the present invention.

Specifically, after the silicon oxide film 2 and amorphous silicon film 3 are sequentially formed on the glass substrate 1 in the manner depicted in FIG. 12A, the amorphous silicon film 3 is converted to a polycrystalline silicon film 3b by performing laser irradiation R1 on the amorphous silicon film 3. The polycrystalline silicon film 3b is then patterned by photolithography and etching.

Figure 12B:
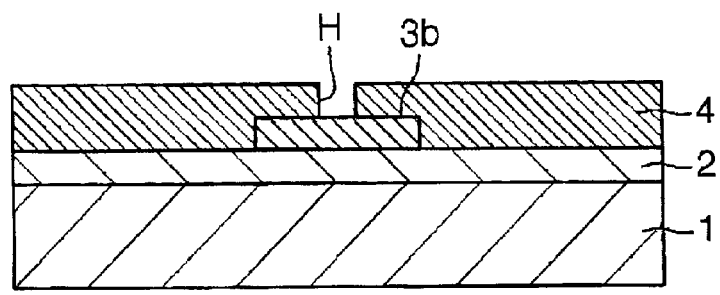

A silicon oxide film 4 is then formed on the polycrystalline silicon film 3b by PECVD, for example, as depicted in FIG. 12B; and a through-hole H is formed at a prescribed location in the silicon oxide film 4 on the polycrystalline silicon film 3b by photolithography and etching, for example.

Figure 12C:
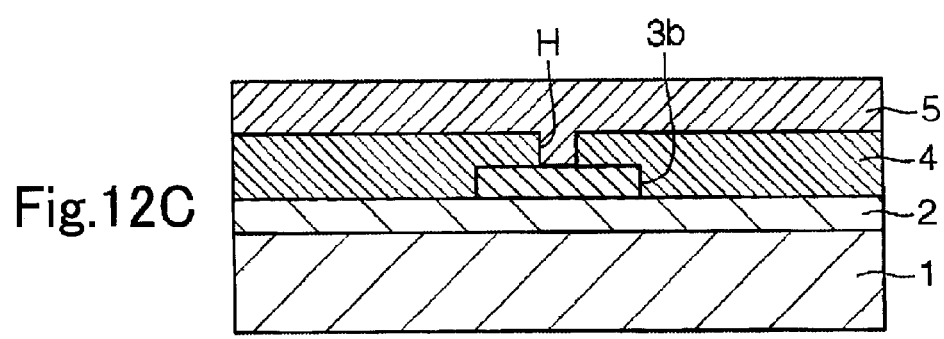

An amorphous silicon film 5 is then deposited onto the silicon oxide film 4 using the LPCVD method, for example, so as to fill the inside of the through-hole H, as depicted in FIG. 12C.

Figure 12D:
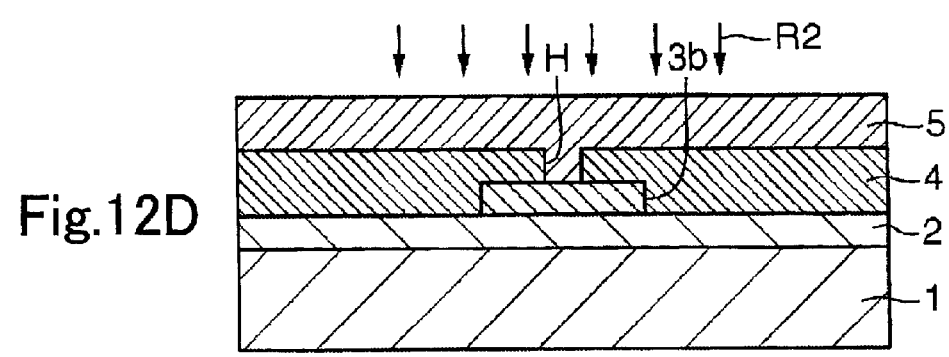

The amorphous silicon film 5 is then brought to a completely-melted state while the unmelted or partially melted state of the polycrystalline silicon film 3b is preserved by performing laser irradiation R2 on the amorphous silicon film 5 deposited onto the silicon oxide film 4, as depicted in FIG. 12D.

Figure 12E:
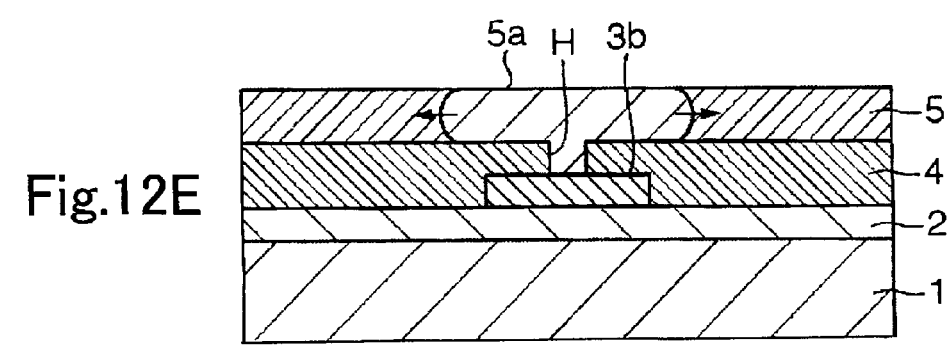

The amorphous silicon film 5 then solidifies after laser irradiation R2, as depicted in FIG. 12E, and a substantially monocrystalline silicon film 5a is formed in the area of the surface of the amorphous silicon film 5 centered around the through-hole H.

The method for patterning the amorphous silicon film 3 after performing laser irradiation R1 for the amorphous silicon film 3 under prescribed conditions was described in the abovementioned embodiment, but laser irradiation R1 may also be performed and a polycrystalline silicon film 3b formed after the amorphous silicon film 3 has been patterned.

Figure 13:
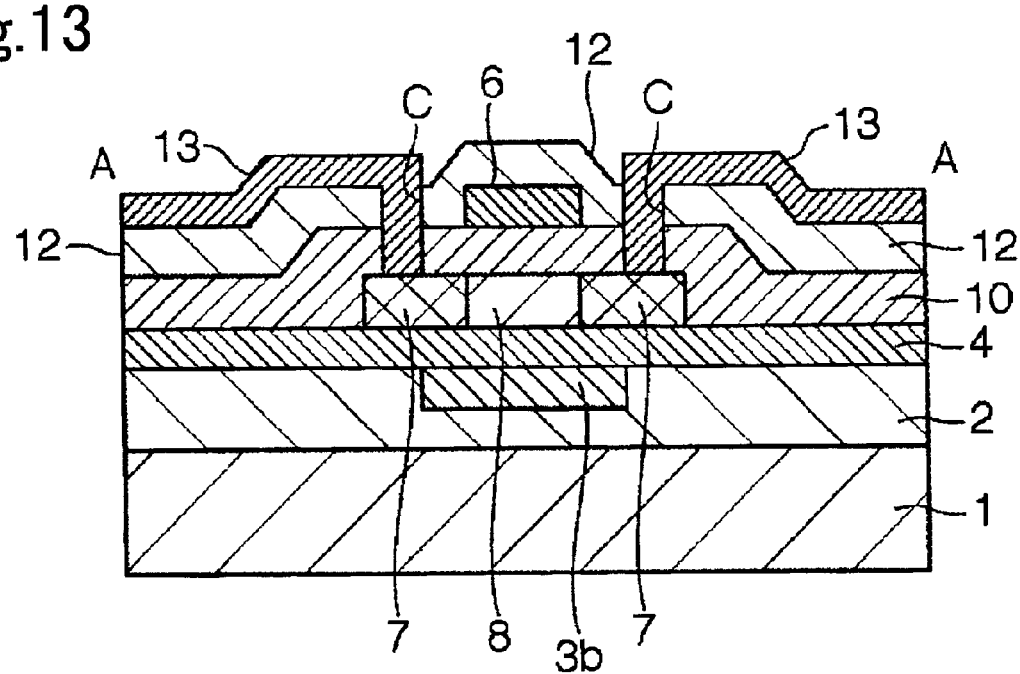
FIG. 13 is a cross-sectional diagram (corresponding to a cross-section at line A—A in FIG. 2) of a thin-film transistor manufactured according to the semiconductor device manufacturing method in embodiment 6 of the present invention.

A thin-film transistor can be manufactured using this silicon film 5a according to the same method as the semiconductor device manufacturing method of embodiment 1. FIG. 13 depicts a cross-sectional diagram of a thin-film transistor formed by this semiconductor device manufacturing method.

The polycrystalline silicon film 3b is depicted in a location directly below the thin-film transistor in FIG. 13 for the sake of simplicity, but the polycrystalline silicon film 3b is not limited to being located directly below the thin-film transistor, and may be provided at any location.

The same effects as in embodiment 1 are achieved by means of embodiment 6 described above. Specifically, a through-hole H is formed in the silicon oxide film 4 disposed between the two layers comprising amorphous silicon films 3 and 5, and irregularities in crystal orientation that occur in the conventional method can be reduced by designing the amorphous silicon film 3 facing the glass substrate 1 to be a polycrystalline silicon film 3b having a substantially coordinated crystal orientation.

As a result, characteristic irregularities can be minimized in a semiconductor device that uses substantially monocrystalline grains having a coordinated crystal orientation. In the case of a thin-film transistor, for example, it is possible to readily obtain a thin-film transistor having a small off-current value, steeper subthreshold characteristics, higher mobility, and exceptionally high-performance by means of the present embodiment 6.

(Embodiment 7)

Figure 14:
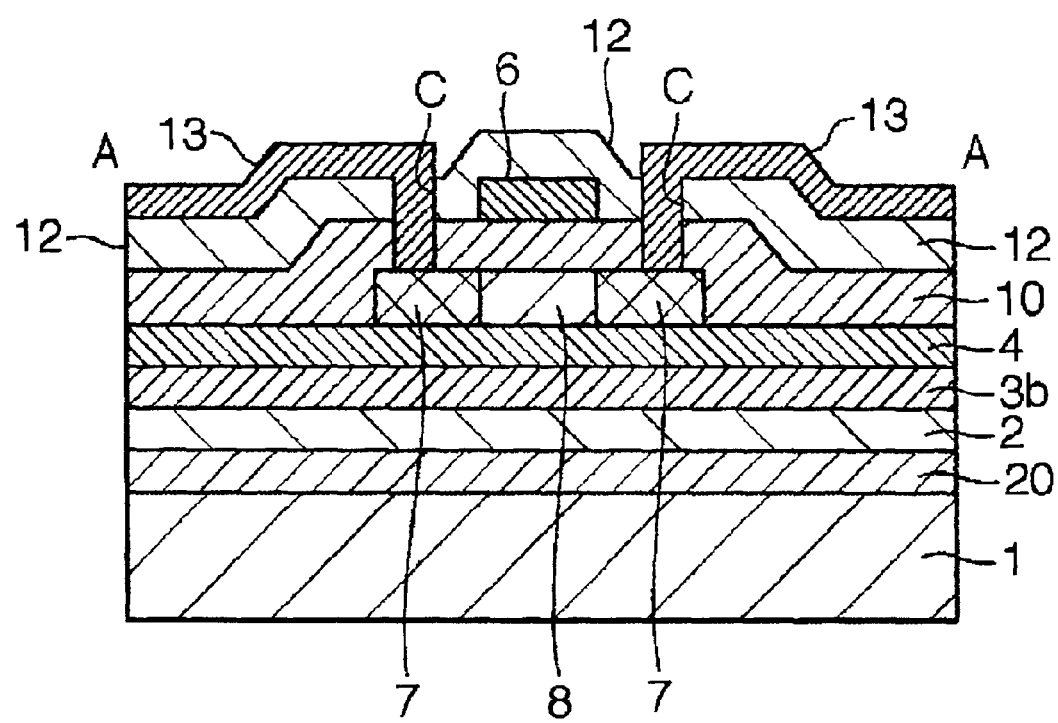
FIG. 14 is a cross-sectional diagram (corresponding to a cross-section at line A—A in FIG. 2) of a thin-film transistor manufactured according to the semiconductor device manufacturing method in embodiment 7 of the present invention.

FIG. 14 depicts a cross-sectional diagram of a thin-film transistor formed according to the semiconductor device manufacturing method according to embodiment 7 of the present invention.

The semiconductor device manufacturing method of the present embodiment 7 is fundamentally identical to the semiconductor thin-film and semiconductor device manufacturing method of embodiment 6. However, the method of embodiment 7 differs in that a silicon nitride film 20 is formed on the glass substrate 1 before the silicon oxide film 2 is formed on the glass substrate 1 in embodiment 6 in the manner depicted in FIG. 12A.

Specifically, the silicon nitride film 20 is formed on the glass substrate 1 in FIG. 14 by a vapor deposition method such as Plasma Enhanced Chemical Vapor Deposition (PECVD), Low Pressure Chemical Vapor Deposition (LPCVD), sputtering, or the like.

A silicon oxide film 2, polycrystalline silicon film 3b, and a silicon oxide film 4 are then formed sequentially on the silicon nitride film 20 in the same manner as in the configuration depicted in FIG. 12D, and a substantially monocrystalline silicon film 5a is formed on the silicon oxide film 4.

A gate electrode 6 is then formed via the silicon oxide film 10 in the area 5b not occupied by the through-hole H of the substantially monocrystalline silicon film 5a, and a source/drain area 7 is formed in the semiconductor thin film 5b on both sides of the gate electrode 6.

A source/drain electrode 13 and a terminal electrode 14 for gate electrode use is also formed on the gate electrode 6 via the silicon oxide film 12 such that the source/drain electrode 13 is connected with the source/drain area 7 via a contact hole C, and the terminal electrode 14 for gate electrode use is connected with the gate electrode 6 via another contact hole.

The film thickness of the silicon nitride film 20 in this step can, for example, be 50 nm, and the film thickness of the silicon oxide film 2 can, for example, be 100 nm–200 nm.

The same effects as in embodiment 1 are achieved by means of embodiment 7 described above. Specifically, the effect of the insulating film shielding the glass substrate 1 from heat generated during laser irradiation R1 and R2 can be enhanced, and heat damage to the glass substrate 1 can be minimized by forming the silicon oxide film 2 after forming the silicon nitride film 20 on the glass substrate 1, because the insulating film directly above the glass substrate 1 is thus provided with a dual-layered composition comprising the silicon nitride film 20 and the silicon oxide film 2.

There is an increased risk of the glass substrate 1 sustaining damage from heat due to the fact that laser irradiation R2 is performed with the amorphous silicon film 5 completely-melted in order to form the amorphous silicon film 5 on the silicon oxide film 4 in the present invention, but this heat damage can be minimized by providing the insulating layer on the glass substrate 1 with a dual-layered composition according to the present embodiment.

Also, when the glass substrate 1 contains impurities that are undesirable for a semiconductor film, such as sodium, aluminum, boron, and the like, the diffusion of these impurities from the substrate into the semiconductor film is effectively prevented by providing the insulating layer above the glass substrate 1 with a dual-layered composition according to the present embodiment.

Another feature of the present embodiment is that a thin-film transistor having exceptional characteristics can easily be obtained by means of these heat damage-reducing effects and impurity diffusion-preventing effects. It is also preferable with regard to silicon crystal growth on the silicon oxide film 4 to make the surface of the silicon oxide film 4 flat to prevent crystal nuclei from forming in the melted amorphous silicon film.

The surface flatness of the silicon oxide film 2 is better than that of the silicon nitride film 20 when the silicon oxide film 2 and the silicon nitride film 20 are compared. Because of this, it is more preferable to form silicon oxide films 2 and 4 having good surface flatness as insulating films directly under the amorphous silicon films 3 and 5, and to form a silicon nitride film 20 between the silicon oxide film 2 and the glass substrate 1. A method for providing an insulating film with a dual-layered composition to minimize heat damage to the glass substrate 1 during laser irradiation R2 was described in the present embodiment, but the insulating film may also be provided with a composition having three or more layers.

(Embodiment 8)

Embodiment 8 of the present invention relates to an electro-optical device provided with a semiconductor device or the like manufactured according to the semiconductor device manufacturing method of the present invention.

Figure 15:
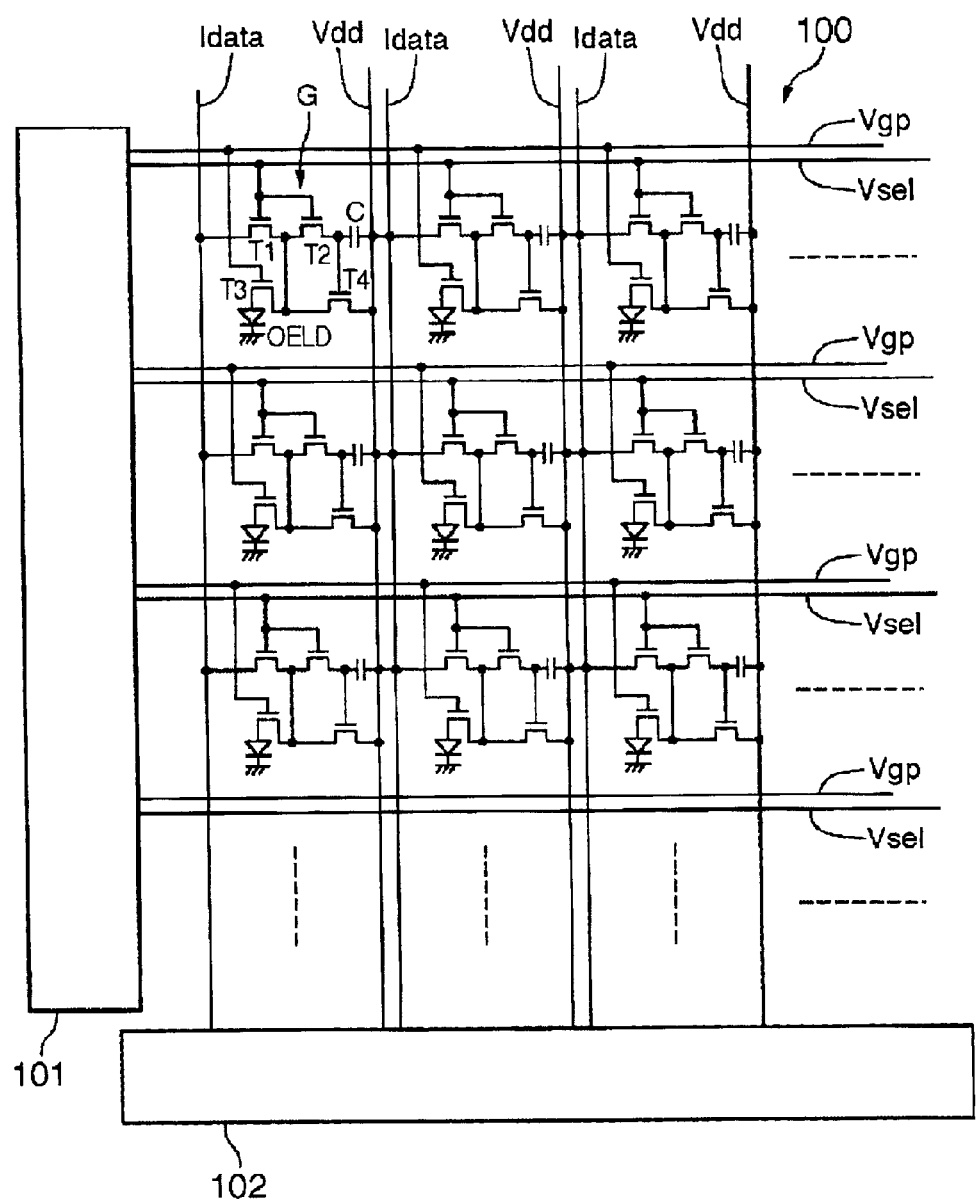
FIG. 15 is a structural diagram of the electro-optical device in embodiment 8 of the present invention.

FIG. 15 is a connection diagram of the electrooptic (display) device 100 according to embodiment 8. The display device 100 of the present embodiment comprises a luminescent layer OELD capable of emitting light as a result of electroluminescent effect in pixel areas G, and a retention capacitance C for storing an electrical current for driving the luminescent layer. The semiconductor device is manufactured according to the manufacturing method of the present invention, and thin-film transistors T1–T4 are provided therein. Scan lines Vsel and luminescence control lines Vgp are supplied to each pixel area G from a driver area 101. Data lines Idata and power supply lines Vdd are supplied to each pixel area G from a driver area 102. An electrical current program for each pixel area G is executed, and the luminescence from the luminescent unit OELD can be controlled by controlling the scan lines Vsel and the data lines Idata.

The same effects as those in each of the abovementioned embodiments are achieved by means of the present embodiment 8 because a semiconductor device that is manufactured according to the semiconductor device manufacturing method of the present invention is provided therein. Specifically, the semiconductor thin film provided in the semiconductor device has few internal defects, the electrical properties of the semiconductor film thereof exhibit a reduced trap density near the mid gap of the forbidden bands in the energy bands, and the semiconductor device is high-grade and has a small off-current value and high mobility due to the fact that barriers to the flow of carriers such as electrons and holes are greatly reduced by the absence of grain boundaries.

The drive circuit described above is an example of a circuit employing electroluminescent elements as luminescent elements, but other circuit configurations are also possible. For example, applying the semiconductor device manufacturing method to the driver area 101 or 102 or employing liquid crystal display elements as luminescent elements could also be possible by modifying the circuit configuration in various ways.

(Embodiment 9)

The present embodiment 9 relates to an electronic appliance comprising a semiconductor device and other components manufactured according to the semiconductor device manufacturing method of the present invention. Examples of electronic appliance of embodiment 9 are cited in FIGS. 16A through 16F.

Figure 16A:
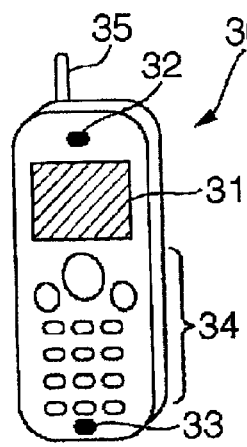
FIG. 16A is an application example of a portable telephone.

FIG. 16A depicts an example of a portable telephone that is equipped with a semiconductor device and other components manufactured according to the manufacturing method of the present invention, wherein the portable telephone 30 comprises an electro-optical device (display panel) 31, a sound output component 32, a sound input component 33, an operating component 34, and an antenna component 35. The semiconductor device manufacturing method of the present invention is applied to the manufacture of the semiconductor devices disposed in the display panel 31 or internal circuits, for example.

Figure 16B:
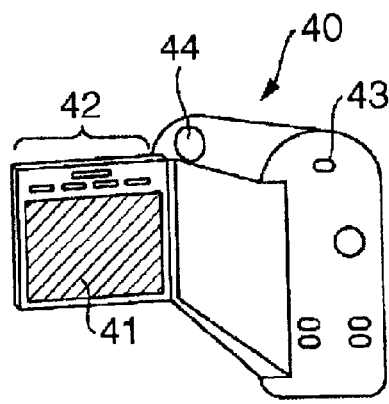
FIG. 16B is an application example of a video camera.

FIG. 16B depicts an example of a video camera that is equipped with a semiconductor device or the like manufactured according to the manufacturing method of the present invention, wherein the video camera 40 comprises an electro-optical device (display panel) 41, an operating component 42, a sound input component 43, and an image receiving component 44. The semiconductor device manufacturing method of the present invention is applied to the manufacture of the semiconductor devices disposed in the display panel 41 or internal circuits, for example.

Figure 16C:
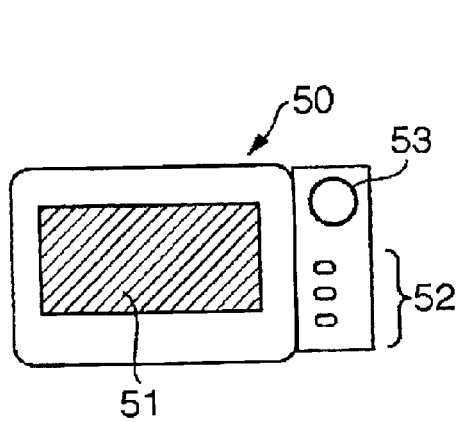
FIG. 16C is an application example of a portable personal computer.

FIG. 16C depicts an example of a personal computer that is equipped with a semiconductor device or the like manufactured according to the manufacturing method of the present invention, wherein the computer 50 comprises an electro-optical device (display panel) 51, an operating component 52, and a camera component 53. The semiconductor device manufacturing method of the present invention is applied to the manufacture of the semiconductor devices disposed in the display panel 51 or internal circuits, for example.

Figure 16D:
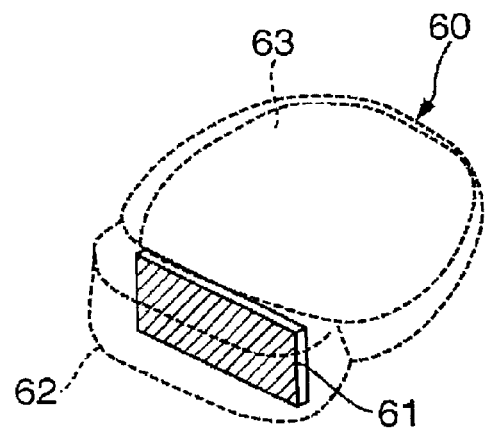
FIG. 16D is an application example of a head mount display.

FIG. 16D depicts an example of a head mount display that is equipped with a semiconductor device or the like manufactured according to the manufacturing method of the present invention, wherein the head mount display 60 comprises an electro-optical device (display panel) 61, an optical system housing 62, and a band component 63. The semiconductor device manufacturing method of the present invention is applied to the manufacture of the semiconductor devices disposed in the display panel 61 or internal circuits, for example.

Figure 16E:
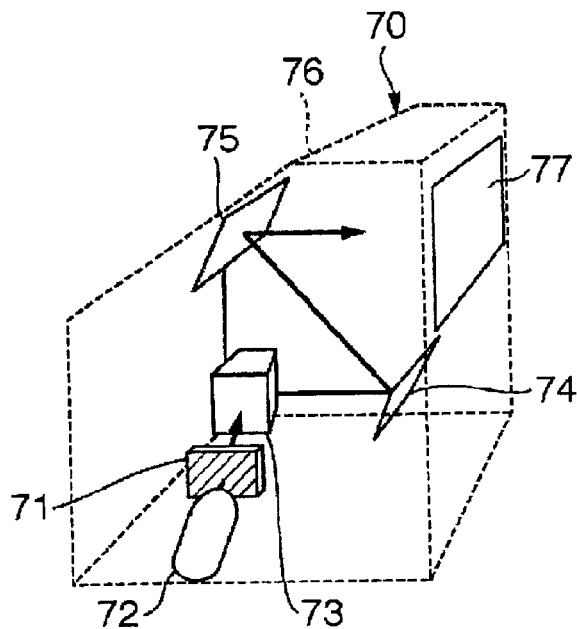
FIG. 16E is an application example of a rear projector.

FIG. 16E depicts an example of a rear projector that is equipped with a semiconductor device or the like manufactured according to the manufacturing method of the present invention, wherein the projector 70 comprises an electro-optical device (optical modulator) 71, a light source 72, an integrated optical system 73, mirrors 74 and 75, and a screen 77 inside a case 76. The semiconductor device manufacturing method of the present invention is applied to the manufacture of the semiconductor devices disposed in the optical modulator 71 or internal circuits, for example.

Figure 16F:
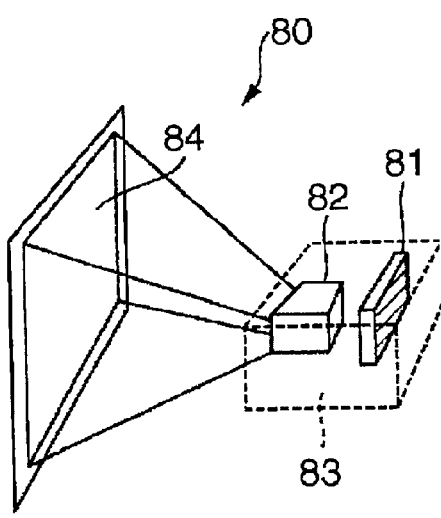
FIG. 16F is an application example of a front projector.

FIG. 16F depicts an example of a front projector that is equipped with a semiconductor device or the like manufactured according to the manufacturing method of the present invention, wherein the projector 80 is capable of displaying images onto a screen 84, and comprises an electro-optical device (image display source) 81 and an optical system 82 inside a case 83. The semiconductor device manufacturing method of the present invention is applied to the manufacture of the semiconductor devices disposed in the image display source 81 or internal circuits, for example.

The semiconductor device manufacturing method pertaining to the present invention is not limited to the examples described above, and can be applied to the manufacture of all types of electronic appliance. Additional application can be made to a display-equipped fax device, digital camera viewfinder, portable TV, DSP device, PDA, electronic notebook, electric signboard, advertising display, IC card, or the like.

The same effects as those provided by the semiconductor devices in each of the aforementioned embodiments can be achieved by means of the electronic appliance of the present invention. Specifically, the semiconductor thin film provided in the semiconductor device has few internal defects, the electrical properties of the semiconductor film thereof exhibit a reduced trap density near the mid gap of the forbidden bands in the energy bands, and the semiconductor device is high-grade and has a small off-current value and high mobility due to the fact that barriers to the flow of carriers such as electrons and holes are greatly reduced by the absence of grain boundaries.

The present invention is not limited by the embodiments described above, and is subject to various modifications or changes within the range of the substance of what is claimed in the present invention.

Industrial Applicability

In accordance with the above-described semiconductor thin-film and semiconductor device manufacturing method of the present invention, it is sufficient to form a through-hole with a larger diameter than that of a hole formed by the conventional method due to the fact that the diameter of the through-hole in the insulating film may be the same size or slightly smaller than the size of a single crystal grain that comprises the polycrystal formed on the layer of silicon film below the insulating film, because an insulating film having a through-hole between two layers of silicon film is provided, the silicon film is partially melted by irradiating a laser thereon, and a substantially monocrystalline film is continuously formed extending via the through-hole from at least part of the layer of silicon film below the insulating film (that continues via the through-hole) to at least part of the layer of silicon film above the insulating film. Costly precision exposure devices and etching devices are therefore unnecessary. Numerous high-performance semiconductor devices can also be formed easily on a large glass substrate, as in large liquid-crystal displays and the like.

A high-performance semiconductor device having a small off-current value, steep subthreshold characteristics, and high mobility can thus be obtained because a substantially monocrystalline silicon film is provided to the semiconductor device, integrated circuit, and electronic appliance of the present invention.

What is claimed is:

1. A semiconductor device, comprising:

an insulating film having a through-hole, a diameter of the through-hole being, generally, equal to or smaller than a size of a single crystal grain of a silicon film located below the insulating film; and a substantially monocrystalline silicon film continuously formed inside the through-hole, in at least part of the layer below the insulating film extending into the through-hole, and in at least part of the layer above the insulating film extending into the through-hole, at least part of the layer below the insulating film and at least part of the layer above the insulating film being formed as substantially monocrystalline silicon films.

2. The semiconductor device according to claim 1, the semiconductor device comprising a substantially polycrystalline silicon film as the layer below the insulating film; and the monocrystalline silicon film being continuously formed from at least part of the polycrystalline silicon film up to the through-hole and the layer above the insulating film.

3. The semiconductor device according to claim 1, the semiconductor device comprising as the layer below the insulating film an insulating film having a concave portion in the part which continues into the through-hole; and the substantially monocrystalline silicon film being continuously formed from at least part of the concave portion up to the through-hole and the layer above the insulating film.

4. The semiconductor device according to claim 1, the semiconductor device comprising a polycrystalline silicon film as the layer below the insulating film; and the substantially monocrystalline silicon film being continuously formed up to the layer above the insulating film, with a crystal grain contained in the polycrystalline silicon film as the nucleus thereof.

5. The semiconductor device according to claim 1, the portion in the surface of the substantially monocrystalline silicon not containing the through-hole being used as a semiconductor thin film.

6. The semiconductor device according to claim 1, a substantially monocrystalline silicon film that constitutes a semiconductor thin film being isolated from the through-hole.

7. An integrated circuit, comprising the semiconductor device according to claim 1.

8. An electro-optical device, comprising the semiconductor device according to claim 1.

9. An electronic appliance, comprising the semiconductor device according to claim 1.

10. A semiconductor device comprising:

a polycrystalline silicon film formed on a first insulating film;

a second insulating film having a through-hole, formed on the polycrystalline silicon film; and a substantially monocrystalline silicon film formed on the second insulating film and contiguous with the polycrystalline silicon film via the through-hole, with crystal grains contained in the polycrystalline silicon film as nuclei thereof.

11. The semiconductor device according to claim 10, the first insulating film and the second insulating film being silicon oxide films, and a silicon nitride film being further formed under the first insulating film.

12. The semiconductor device according to claim 10, the portion in the surface of the substantially monocrystalline silicon not containing the through-hole being used as a semiconductor thin film.

13. The semiconductor device according to claim 10, the substantially monocrystalline silicon film that constitutes a semiconductor thin film being isolated from the through-hole.

14. An integrated circuit, comprising the semiconductor device according to claim 13.

15. An electro-optical device, comprising the semiconductor device according to claim 10.

16. An electronic appliance, comprising the semiconductor device according to claim 10.

17. A semiconductor device comprising:

a first insulating film having a concave portion that contains substantially polycrystalline silicon;

a second insulating film having a through-hole in a location continuing to the concave portion, formed on the first insulating film; and a substantially monocrystalline silicon film formed on the second insulating film and contiguous with the polycrystalline silicon film in the concave portion via the through-hole, with crystal grains contained in the polycrystalline silicon film as nuclei thereof.

18. The semiconductor device according to claim 17, the first insulating film and the second insulating film being silicon oxide films, and a silicon nitride film being further formed under the first insulating film.

19. The semiconductor device according to claim 17, the portion in the surface of the substantially monocrystalline silicon not containing the through-hole being used as a semiconductor thin film.

20. The semiconductor device according to claim 17, the substantially monocrystalline silicon film that constitutes a semiconductor thin film being isolated from the through-hole.

21. An integrated circuit, comprising the semiconductor device according to claim 17.

22. An electro-optical device, comprising the semiconductor device according to claim 17.

23. An electronic appliance, comprising the semiconductor device according to claim 17.

* * * * *